(12) United States Patent
Zhao et al.

(10) Patent No.: US 11,641,770 B2
(45) Date of Patent: *May 2, 2023

(54) DISPLAY PANEL

(71) Applicant: Wuhan China Star Optoelectronics Semiconductor Display Technology Co., Ltd., Hubei (CN)

(72) Inventors: Yong Zhao, Hubei (CN); Liang Sun, Hubei (CN); Shoucheng Wang, Hubei (CN); Yaojen Chang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 150 days.

This patent is subject to a terminal disclaimer.

(21) Appl. No.: 16/621,945

(22) PCT Filed: Nov. 6, 2019

(86) PCT No.: PCT/CN2019/116094
§ 371 (c)(1),
(2) Date: Dec. 12, 2019

(87) PCT Pub. No.: WO2020/155731
PCT Pub. Date: Aug. 6, 2020

(65) Prior Publication Data
US 2021/0335904 A1  Oct. 28, 2021

(30) Foreign Application Priority Data
Jan. 31, 2019 (CN) .......................... 201910100351.2

(51) Int. Cl.
*H01L 27/32* (2006.01)

(52) U.S. Cl.
CPC ...... *H01L 27/3216* (2013.01); *H01L 27/3218* (2013.01)

(58) Field of Classification Search
CPC .......................................... H01L 27/3206–3218
See application file for complete search history.

(56) References Cited

U.S. PATENT DOCUMENTS

| 10,971,054 | B2 * | 4/2021 | Zhao | ..................... G09G 3/2003 |
| 11,038,000 | B2 * | 6/2021 | Zhao | ................... H01L 27/3216 |
| 2019/0355794 | A1 * | 11/2019 | Dai | .......................... C23C 14/12 |

FOREIGN PATENT DOCUMENTS

| CN | 106816449 | * | 6/2017 | ............. H01L 27/32 |
| CN | 106816449 | A | 6/2017 | |
| CN | 108364983 | A | 8/2018 | |
| CN | 207966982 | * | 10/2018 | ............. H01L 27/32 |
| CN | 207966982 | U | 10/2018 | |
| CN | 109817682 | A | 5/2019 | |

* cited by examiner

*Primary Examiner* — Eric K Ashbahian
(74) *Attorney, Agent, or Firm* — Taft Stettinius & Hollister LLP

(57) ABSTRACT

A display panel is provided. At least two of each of first pixels, each of second pixels, and each of third pixels of the display panel are alternately arranged. A shape of each of first pixels includes an ellipse or a circle. A shape of an edge of each of the second pixels or each of the third pixels corresponds to a concave arc. A sum of a radius of curvature of an edge of each of the first pixels and a width of a predetermined gap is equal to a radius of curvature of the concave arc corresponding to the edge of one of each of the second pixels and each of the third pixels. An aperture ratio of a pixel is effectively increased.

6 Claims, 17 Drawing Sheets

DISPLAY PANEL

CROSS-REFERENCE TO RELATED APPLICATIONS

This application is a U.S. National Phase of International PCT Application No. PCT/CN2019/116094 filed Nov. 6, 2019, which claims the benefit of Chinese Patent Application Serial No. 201910100351.2 filed Jan. 31, 2019, the contents of each application are incorporated herein by reference in their entirety.

FIELD OF INVENTION

The present disclosure relates to the field of display technologies, and more particularly to a display panel.

BACKGROUND OF INVENTION

Luminescent material layers of pixels in conventional organic light emitting diode (OLED) display panels are generally formed by evaporation processes. In processes of forming the luminescent material layers of the pixels, a certain gap needs to be reserved between the luminescent material layers of the adjacent two pixels to prevent luminescent materials of different pixels from interfering with each other.

Due to limitations of shapes of the pixels and a gap between the pixels, unused spaces between the pixels in the conventional OLED display panels are large, and thus aperture ratios of the pixels in the conventional OLED display panels are low.

Therefore, it is necessary to propose a new technical solution to solve the above technical issues.

SUMMARY OF INVENTION

An object of the present disclosure is to provide a display panel capable of effectively increasing an aperture ratio of a pixel.

In order to solve the above issues, a technical solution of an embodiment of the present disclosure is as follows.

An embodiment of the present disclosure provides a display panel. The display panel includes at least two first pixels, at least two second pixels, and at least two third pixels. At least two of each of the first pixels, each of the second pixels, and each of the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction. A shape of each of the first pixels includes an ellipse or a circle. A shape of an edge of one of each of the second pixels and each of the third pixels in the third direction and the fourth direction corresponds to a concave arc, a sum of a radius of curvature of a shape of an edge of each of the first pixels facing one of each of the second pixels and each of the third pixels and a width of a predetermined gap is equal to a radius of curvature of the concave arc corresponding to the edge of one of each of the second pixels and each of the third pixels in the third direction and the fourth direction. The predetermined gap is a gap between an edge of one of each of the second pixels and each of the third pixels and an edge of each adjacent first pixel in one of the third direction and the fourth direction. An arc and an extended arc thereof corresponding to an edge of third pixel facing the first pixel and an arc and an extended arc thereof corresponding to an edge of the second pixel facing the first pixel form a predetermined shape. The predetermined shape includes a circle or an ellipse.

In an embodiment of the present disclosure, a width of the predetermined gap in the third direction is equal to a width of the predetermined gap in the fourth direction.

In an embodiment of the present disclosure, a shape of each of the first pixels is the same as or similar to the predetermined shape.

In an embodiment of the present disclosure, a center of a shape of each of the first pixels is the same as a center of the predetermined shape.

An embodiment of the present disclosure further provides a display panel. The display panel includes at least two first pixels, at least two second pixels, and at least two third pixels. At least two of each of the first pixels, each of the second pixels, and each of the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction. A shape of each of the first pixels includes an ellipse or a circle. A shape of an edge of one of each of the second pixels and each of the third pixels in the third direction and the fourth direction corresponds to a concave arc, a sum of a radius of curvature of a shape of an edge of each of the first pixels facing one of each of the second pixels and each of the third pixels and a width of a predetermined gap is equal to a radius of curvature of the concave arc corresponding to the edge of one of each of the second pixels and each of the third pixels in the third direction and the fourth direction.

In an embodiment of the present disclosure, the predetermined gap is a gap between an edge of one of each of the second pixels and each of the third pixels and an edge of each adjacent first pixel in one of the third direction and the fourth direction.

In an embodiment of the present disclosure, a width of the predetermined gap in the third direction is equal to a width of the predetermined gap in the fourth direction.

In an embodiment of the present disclosure, an arc and an extended arc thereof corresponding to an edge of third pixel facing the first pixel and an arc and an extended arc thereof corresponding to an edge of the second pixel facing the first pixel form a predetermined shape, and the predetermined shape includes a circle or an ellipse.

In an embodiment of the present disclosure, a shape of each of the first pixels is the same as or similar to the predetermined shape.

In an embodiment of the present disclosure, a center of a shape of each of the first pixels is the same as a center of the predetermined shape.

In an embodiment of the present disclosure, when the shape of each of the first pixels includes an ellipse, a long axis of the ellipse points to one of each of the second pixels and each of the third pixels, a short axis of the ellipse points to the other of each of the second pixels and each of the third pixels.

In an embodiment of the present disclosure, an angle between the long axis of the ellipse and the first direction or the second direction ranges between 0 degree and 90 degrees.

In an embodiment of the present disclosure, when a shape of each of the second pixels includes a circle or an ellipse, and a shape of each of the third pixels includes a concave arc or a combined shape of a concave arc and a convex arc, the shape of each of the third pixels includes a curvature of one of at least four concave arcs that is greater or less than another of the at least four concave arcs.

In an embodiment of the present disclosure, when a shape of each of the second pixels and a shape of each of the third pixels both include a concave arc or a combined shape of a concave arc and a convex arc, a curvature of one of at least four concave arcs of the shape of each of the third pixels is greater or equal to a curvature of one of at least four concave arcs of the shape of each of the second pixels.

In an embodiment of the present disclosure, shapes of edges of two of each of the first pixels, each of the second pixels, and each of the third pixels are complementary in one of the first direction, the second direction, the three direction, and the fourth direction.

In an embodiment of the present disclosure, each of the first pixels, each of the second pixels, and each of the third pixels are ones of different red, green, and blue pixels.

In an embodiment of the present disclosure, a ratio y1 of an aperture ratio of the red pixel to an aperture ratio of the green pixel is in the range of $0.78e^{\wedge}(-1.98r) \le y1 \le 2.297e^{\wedge}(-1.85r)$, and $0.1 \le y1 \le 3$, where r is a ratio of a luminous efficiency of the red pixel to a luminous efficiency of the green pixel, a ratio y2 of an aperture ratio of the blue pixel to the aperture ratio of the green pixel is in a range of $1.32e^{\wedge}(-10.7b) \le y2 \le 5.95e^{\wedge}(-14.1b)$, and $0.3 \le y2 \le 4$, where b is a ratio of a luminous efficiency of the blue pixel to the luminous efficiency of the green pixel.

In an embodiment of the present disclosure, the ratio y1 of the aperture ratio of the red pixel to the aperture ratio of the green pixel is in a range of $0.2 \le y1 \le 2.2$, the ratio y2 of the aperture ratio of the blue pixel to the aperture ratio of the green pixel is in the range of $0.5 \le y2 \le 3.6$.

In an embodiment of the present disclosure, when the shape of each of the first pixels includes the ellipse, a ratio of a long axis to a short axis of the ellipse is in a range of 1 to 5.

In an embodiment of the present disclosure, the ratio of the long axis to the short axis of the ellipse is in a range of 1 to 3.

In the embodiment of the present disclosure, because a shape of the first pixel includes a circle or an ellipse, and a shape of an edge of one of each of the second pixels and each of the third pixels corresponds to a concave arc, a sum of a radius of curvature of a shape of an edge of each of the first pixels and a width of a predetermined gap is equal to a radius of curvature of the concave arc corresponding to the edge of one of each of the second pixels and each of the third pixels, and therefore, the embodiment of present disclosure can effectively reduce an unused space between pixels, thereby effectively increasing an aperture ratio of the pixels.

In order to make the above description of the present disclosure more comprehensible, preferred embodiments are described below, and are described in detail below with reference to the accompanying drawings.

DETAILED DESCRIPTION OF PREFERRED EMBODIMENTS

The term "embodiment" as used in this specification means an embodiment, an example, or an illustration. In addition, the article "a" as used in the specification and the appended claims may be construed as "one or more." The singular form can be clearly defined unless otherwise specified or from the context.

Any two of a first embodiment, a second embodiment, a third embodiment, and a fourth embodiment of a display panel 10 of the present disclosure are similar or same.

In the first embodiment, the second embodiment, the third embodiment, and the fourth embodiment of the present disclosure, the display panel 10 can be, for example, an organic light emitting diode (OLED) panel or the like.

The display panel includes at least two pixel repeating units, and the at least two pixel repeating units are arranged in an array (one-dimensional array or two-dimensional array). The pixel repeating unit includes one first pixel 101, one second pixel 102, one third pixel 103, and at most one of the first pixel 101, the second pixel 102, and the third pixel 103.

Figure 1:
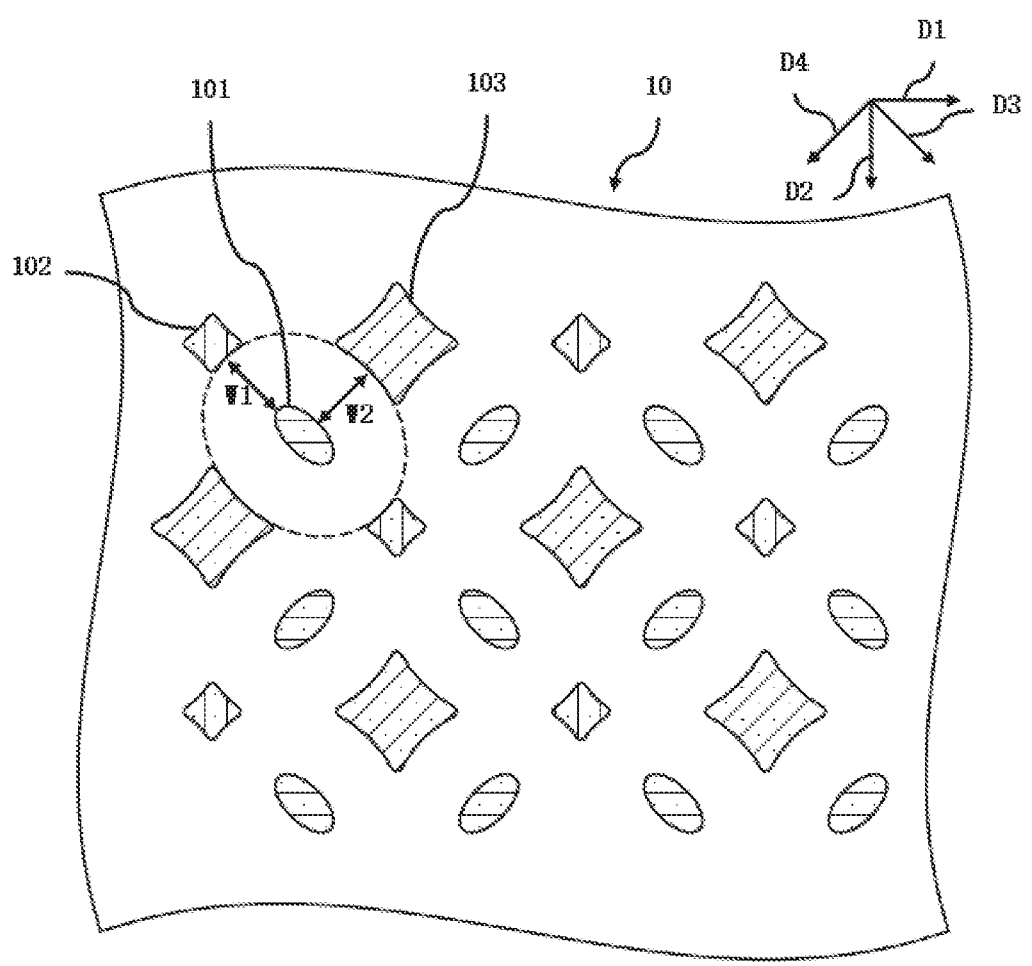
FIG. 1 is a schematic view of a display panel according to a first embodiment of the present disclosure.
Figure 2:
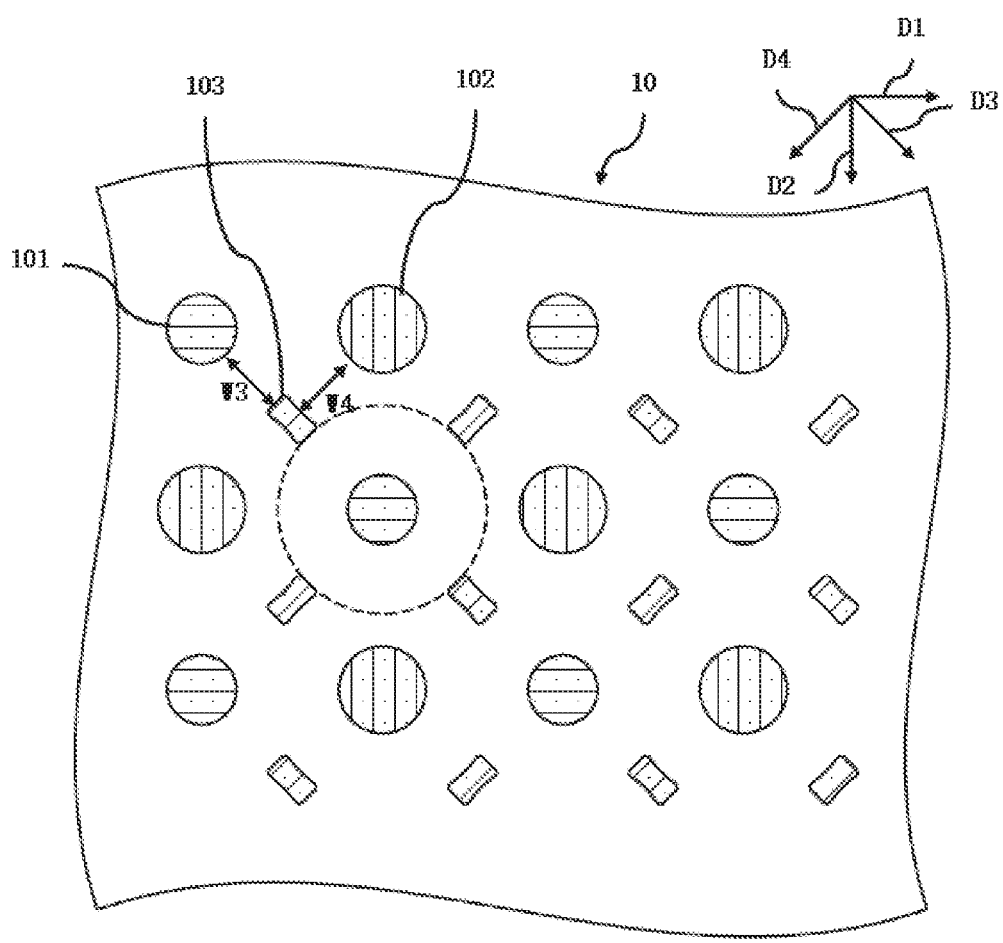
FIG. 2 is a schematic view of a display panel according to a second embodiment of the present disclosure.
Figure 3:
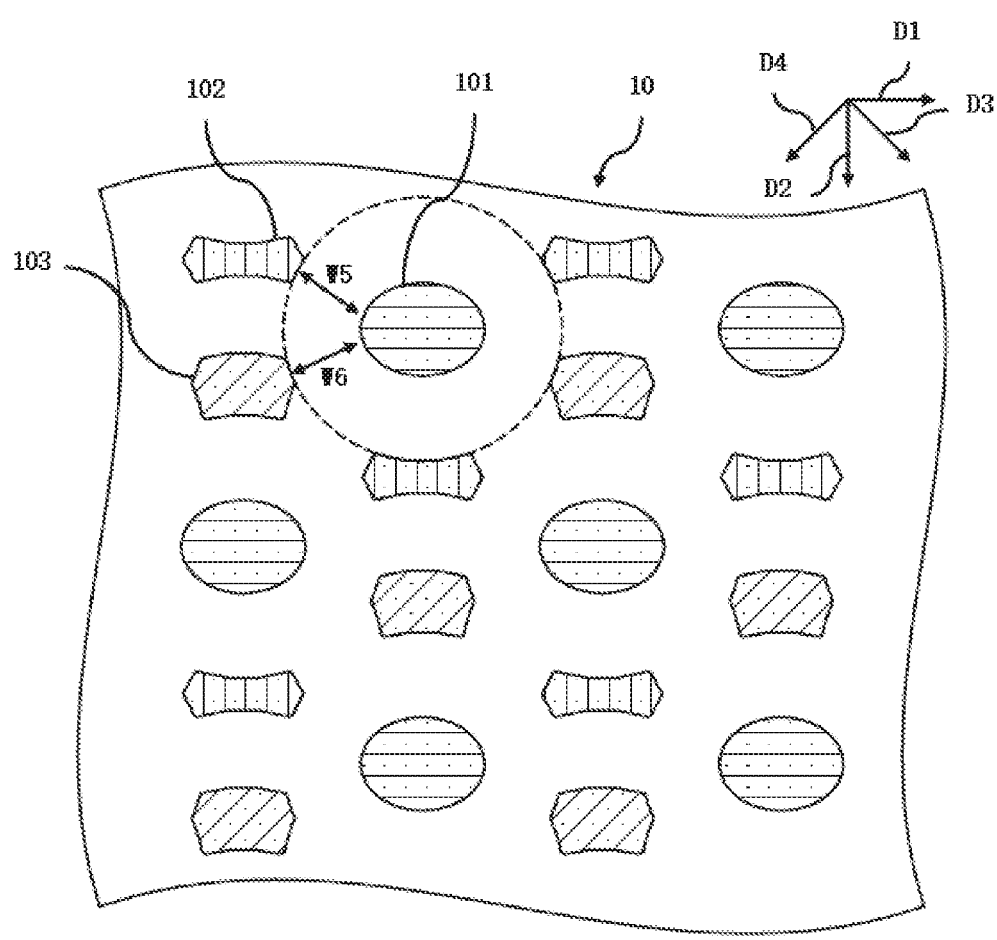
FIG. 3 is a schematic view of a display panel according to a third embodiment of the present disclosure.
Figure 4:
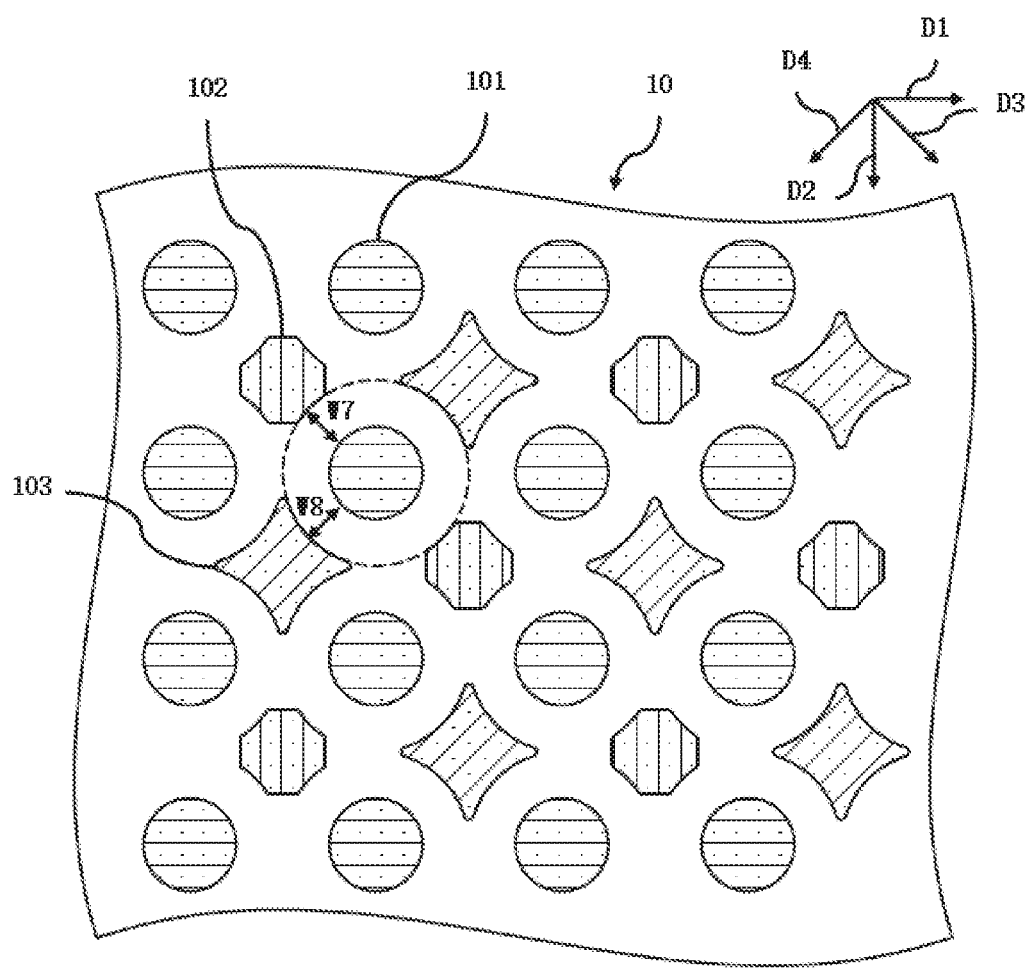
FIG. 4 is a schematic view of a display panel according to a fourth embodiment of the present disclosure.

For example, the pixel repeating unit includes one first pixel 101, one second pixel 102, and one third pixel 103, as shown in FIG. 3. Or the pixel repeating unit includes two first pixels 101, one second pixel 102, one third pixel 103, as shown in FIG. 1 and FIG. 4. Or, the pixel repeating unit includes one first pixel 101, two second pixels 102, and one third pixel 103. Or, the pixel repeating unit includes one first pixel 101, one second pixel 102, and two third pixels 103 as shown in FIG. 2.

The first pixel 101, the second pixel 102, and the third pixel 103 are ones of different red, green, and blue pixels.

The shapes of the first pixel 101, the second pixel 102, and the third pixel 103 are formed (connected) by a convex arc and/or a concave arc.

Specifically, a shape of at least one of the first pixel 101, the second pixel 102, and the shape of at most two of the first pixel 101, the second pixel 102, and the third pixel 103 is a shape formed by a convex arc. The shape of the rest of at least two of the first pixel 101, the second pixel 102, and the third pixel 103 is a shape formed by a concave arc. Or, the shape of the rest of at least two of the first pixel 101, the second pixel 102, and the third pixel 103 are formed by a convex arc and a concave arc (two ends of a convex arc are respectively connected to two concave arcs). At least one of the first pixel 101, the second pixel 102, and the third pixel 103 is circular or elliptical, and at most two of the first pixel 101, the second pixel 102, and the third pixel 103 are circular or elliptical. Shapes of edges of two of the first pixel 101, the second pixel 102, and the third pixel 103 are complementary in one of a first direction D1, a second direction D2, a third direction D3, and a fourth direction D4. The first direction D1 is perpendicular to the second direction D2, the third direction D3 is a direction having an angle of less than 90 degrees with the first direction D1, and the fourth direction D4 is perpendicular to the third direction D3.

The term "complementary" means that two shapes have opposing projections and recesses, and when the two shapes are in contact with each other by moving toward each other, the projections and the recesses of the two shapes are fitted or contained.

For example, as shown in FIG. 1, the first pixel 101 and the second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4.

As shown in FIG. 2, the first pixel 101 and the third pixel 103 respectively have a protrusion and a recess in the third direction D3, and the first pixel 101 and the third pixel 103 are complementary in the third direction D3. The second pixel 102 and the third pixel 103 respectively have a protrusion and a recess in the fourth direction D4, and the second pixel 102 and the third pixel 103 are complementary in the fourth direction D4.

As shown in FIG. 3, the first pixel 101 and second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4. The second pixel 102 and the third pixel 103 respectively have a protrusion and a recess in the second direction D2, and the second pixel 102 and the third pixel 103 are complementary in the second direction D2.

As shown in FIG. 4, the first pixel 101 and second pixel 102 respectively have a protrusion and a recess in the third direction D3, and the first pixel 101 and the second pixel 102 are complementary in the third direction D3. The first pixel 101 and the third pixel 103 respectively have a protrusion and a recess in the fourth direction D4, and the first pixel 101 and the third pixel 103 are complementary in the fourth direction D4.

At least two of each of the first pixels 101, each of the second pixels 102, and each of the third pixels 103 are alternately arranged in at least one of the first direction D1, the second direction D2, the third direction D3, and the fourth direction D4.

Specifically, at least one of the first pixels 101 is located in a range surrounded by at least four of the second pixels 102, and at least one of the first pixels 101 is located in a range surrounded by at least four of the third pixels 103. At least one of the second pixels 102 is located in a range surrounded by at least four of the first pixels 101, and at least one of the second pixels 102 is located in a range surrounded by at least four of the third pixels 103. At least one of the third pixels 103 is located in a range surrounded by at least four of the first pixels 101, and at least one of the third pixels 103 is located in a range surrounded by at least four of the second pixels 102.

As shown in FIG. 1, the second pixel 102 and the third pixel 103 are alternately arranged in the first direction D1 and the second direction D2, and the first pixel 101 and the second pixel 102 are alternately arranged in the third direction D3, the first pixel 101 and the third pixel 103 are alternately arranged in the fourth direction D4.

As shown in FIG. 2, the second pixel 102 and the third pixel 103 are alternately arranged in the first direction D1 and the second direction D2, and the first pixel 101 and the second pixel 102 are alternately arranged in the third direction D3, the first pixel 101 and the third pixel 103 are alternately arranged in the fourth direction D4.

As shown in FIG. 3, the first pixel 101, the second pixel 102, and the third pixel 103 are alternately arranged in the second direction D2, the third direction D3, and the fourth direction D4. The second pixel 102 and the third pixel 103 surround the first pixel 101, and the second pixel 102 and the third pixel 103 are spaced apart.

As shown in FIG. 4, the second pixel 102 and the third pixel 103 are alternately arranged in the first direction D1 and the second direction D2, the first pixel 101 and the second pixel 102 are alternately arranged in the third direction D3, and the first pixel 101 and the third pixel 103 are alternately arranged in the fourth direction D4.

A first gap is formed between the first pixel 101 and the adjacent second pixel 102, a second gap is formed between the second pixel 102 and the adjacent third pixel 103, and a third gap is formed between the third pixel 103 and the adjacent first pixel 101.

At least a portion of the third pixel 103 protrudes toward the first gap, at least a portion of the first pixel 101 protrudes toward the second gap, and at least a portion of the second pixel 102 protrudes toward the third gap.

A width of a gap between two of the first pixel 101, the second pixel 102, and the third pixel 103 alternately arranged in the third direction D3 is same as a width of a gap between two of the first pixel 101, the second pixel 102, and the third pixel 103 alternately arranged in the fourth direction D4.

As shown in FIG. 1, a width W1 of a gap between the first pixel 101 and the second pixel 102 in the third direction D3 is equal to a width W2 of a gap between the first pixel 101 and the third pixel 103 in the fourth direction D4.

As shown in FIG. 2, a width W3 of a gap between the first pixel 101 and the third pixel 103 in the third direction D3 is equal to a width W4 of a gap between the third pixel 103 and the second pixel 102 in the fourth direction D4.

As shown in FIG. 3, a width W5 of a gap between the first pixel 101 and the second pixel 103 in the third direction D3 is equal to a width W6 of a gap between the first pixel 101 and the third pixel 103 in the fourth direction D4.

As shown in FIG. 4, a width W7 of a gap between the first pixel 101 and the second pixel 102 in the third direction D3 is equal to a width W8 of a gap between the first pixel 101 and the third pixel 103 in the fourth direction D4.

The shape of the first pixel 101 is circular or elliptical. The shape of the second pixel 102 is one of shapes formed by a convex arc and/or a concave arc. The shape of the third pixel 103 is a shape formed by a concave arc or a combination of a concave arc and a convex arc. The circular or elliptical shape is one of the shapes formed by the convex arc. It is understood that, the shape formed by the convex arc may include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

As shown in FIG. 1, the shape of the first pixel 101 is circular or elliptical, and the shapes of the second pixel 102 and the third pixel 103 are the shapes composed of four-segment convex arc and four-segment concave arc.

As shown in FIG. 2, the shape of the first pixel 101 is circular or elliptical, the shape of the second pixel 102 is circular or elliptical, and the shape of the third pixel 103 is the shape composed of four-segment convex arc and four-segment concave arc.

As shown in FIG. 3, the shape of the first pixel 101 is circular or elliptical, the shape of the second pixel 102 is the shape composed of six-segment convex arc and six-segment concave arc, and the shape of the third pixel 103 is the shape composed of seven-segment convex arc and five-segment concave arc.

As shown in FIG. 4, the shape of the first pixel 101 is circular or elliptical, the shape of the second pixel 102 is the shape composed of eight-segment convex arc and eight-segment concave arc, and the shape of the third pixel 103 is the shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first pixel 101, the second pixel 102, and the third pixel 103 are different.

In the above technical solution, the shapes of the first pixel, the second pixel, and the third pixel are shapes formed by a convex arc and/or a concave arc, and shapes of the edges of two of the first pixel, the second pixel and the third pixel are complementary, and therefore, unused space between the pixels in the display panel of the embodiment of the present disclosure can be effectively reduced (improved), and the embodiment of the present disclosure can effectively increase an aperture ratio of a pixel.

In a case where the shape of the first pixel 101 is circular or elliptical, a shape of an edge of one of each of the second pixels 102 and each of the third pixels 103 in the third direction D3 and the fourth direction D4 corresponds to a concave arc, a sum of a radius of curvature of a shape of an edge of each of the first pixels 101 facing one of each of the second pixels 102 and each of the third pixels 103 and a width of a predetermined gap is equal to a radius of curvature of the concave arc corresponding to the edge of one of each of the second pixels 102 and each of the third pixels 103 in the third direction D3 and the fourth direction D4.

The predetermined gap is a gap between an edge of one of each of the second pixels 102 and each of the third pixels 103 and an edge of each adjacent first pixel 101 in one of the third direction D3 and the fourth direction D4. A width of the predetermined gap in the third direction D3 is equal to a width of the predetermined gap in the fourth direction D4.

As shown in FIG. 1, the first pixel 101 has an elliptical shape, and a major axis of the ellipse is parallel to the third direction D3, and a minor axis of the ellipse is parallel to the fourth direction D4. In the third direction D3, the shape of the second pixel 102 toward the edge of the first pixel 101 corresponds to a concave arc. A radius of curvature of the concave arc corresponding to the edge of the first pixel 101 that the third pixel 103 faces is equal to a sum of a long axis of the first pixel 101 and a width W1 of the gap between the first pixel 101 and the second pixel 102 in the third direction D3. In the fourth direction D4, the shape of the third pixel 103 toward the edge of the first pixel 101 corresponds to a concave arc. A radius of curvature of the concave arc corresponding to the edge of the first pixel 101 that the third pixel 103 faces is equal to a sum of a long axis of the first pixel 101 and a width W2 of the gap between the first pixel 101 and the third pixel 103 in the fourth direction D4.

As shown in FIG. 2, the shape of the first pixel 101 is circular. In the third direction D3, the shape of the third pixel 103 toward the edge of the first pixel 101 corresponds to a concave arc. A radius of curvature of the concave arc corresponding to the edge of the first pixel 101 that the third pixel 103 faces is equal to a sum of a radius of the first pixel 101 and a width W3 of the gap between the first pixel 101 and the third pixel 103 in the third direction D3. In the fourth direction D4, the shape of the third pixel 103 toward the edge of the first pixel 101 corresponds to a concave arc. A radius of curvature of the concave arc corresponding to the edge of the first pixel 101 that the third pixel 103 faces is equal to a width W3 of the gap between the first pixel 101 and the third pixel 103 in the fourth direction D4.

As shown in FIG. 3, the shape of the first pixel 101 is elliptical, the major axis of the ellipse is parallel to the first direction D1, and the minor axis of the ellipse is parallel to the second direction D2. In the third direction D3, the shape of the second pixel 102 toward the edge of the first pixel 101 corresponds to a concave arc. A radius of curvature of the concave arc corresponding to the edge of the first pixel 101 that the second pixel 102 faces is equal to a sum of a radius of curvature of the concave arc corresponding to the edge of the second pixel 102 that the first pixel 101 faces and a width W5 of the gap between the first pixel 101 and the second pixel 102 in the third direction D3. In the fourth direction D4, the shape of the third pixel 103 toward the edge of the first pixel 101 corresponds to a concave arc. A radius of curvature of the concave arc corresponding to the edge of the first pixel 101 that the third pixel 103 faces is equal to a sum of a radius of curvature of the concave arc corresponding to the edge of the third pixel 103 that the first pixel 101 faces and a width W6 of the gap between the first pixel 101 and the third pixel 103 in the fourth direction D4.

As shown in FIG. 4, the shape of the first pixel 101 is circular. In the third direction D3, the shape of the second pixel 102 toward the edge of the first pixel 101 corresponds to a concave arc. A radius of curvature of the concave arc corresponding to the edge of the first pixel 101 that the second pixel 102 faces is equal to a sum of a radius of curvature of the concave arc corresponding to the edge of the second pixel 102 that the first pixel 101 faces and a width W7 of the gap between the first pixel 101 and the second pixel 102 in the third direction D3. In the fourth direction D4, the shape of the third pixel 103 toward the edge of the first pixel 101 corresponds to a concave arc. A radius of curvature of the concave arc corresponding to the edge of the first pixel 101 that the third pixel 103 faces is equal to a sum of a radius of curvature of the concave arc corresponding to the edge of the third pixel 103 that the first pixel 101 faces and a width W8 of the gap between the first pixel 101 and the third pixel 103 in the fourth direction D4.

An arc and an extended arc thereof corresponding to an edge of third pixel 103 facing the first pixel 101 and an arc and an extended arc thereof corresponding to an edge of the second pixel 102 facing the first pixel 101 form a predetermined shape, and the predetermined shape includes a circle or an ellipse.

As shown in FIG. 1, the predetermined shape is an elliptical shape. As shown in FIG. 2, the predetermined shape is a circular shape. As shown in FIG. 3, the predetermined shape is an elliptical shape. As shown in FIG. 4, the predetermined shape is a circle.

A shape of each of the first pixels 101 is the same as or similar to the predetermined shape.

A center of a shape of each of the first pixels 101 is the same as a center of the predetermined shape.

When the shape of each of the first pixels 101 includes an ellipse, a long axis of the ellipse points to one of each of the second pixels 102 and each of the third pixels 103, a short axis of the ellipse points to the other of each of the second pixels 102 and each of the third pixels 103.

As shown in FIG. 1, the long axis of the ellipse corresponding to the shape of the first pixel 101 is directed to the second pixel 102, and correspondingly, the short axis is directed to the third pixel 103.

As shown in FIG. 3, the short axis of the ellipse corresponding to the shape of the first pixel 101 is directed to the second pixel 102 and the third pixel 103.

An angle between the long axis of the ellipse and the first direction or the second direction ranges between 0 degree and 90 degrees.

As shown in FIG. 1, the angle between the long axis of the ellipse and the first direction D1 is in the range of 40 to 50 degrees. As shown in FIG. 3, the angle between the long axis of the ellipse and the first direction D1 is in a range of 0 to 10 degrees. Correspondingly, the angle between the long axis of the ellipse and the second direction D2 is in the range of 80 degrees to 90 degrees.

When a shape of each of the second pixels 102 includes a circle or an ellipse, and a shape of each of the third pixels 103 includes a concave arc or a combined shape of a concave arc and a convex arc, the shape of each of the third pixels 103 includes a curvature of one of at least four concave arcs that is greater or less than (adjacent) another of the at least four concave arcs.

As shown in FIG. 2, the second pixel 102 has a circular shape, and a radius of curvature of the concave arc corresponding to the edge of the second pixel 102 that the third pixel 103 faces is greater than a radius of curvature of the concave arc corresponding to the edge of the first pixel 101 that the third pixel 103 faces.

When a shape of each of the second pixels 102 and a shape of each of the third pixels 103 both include a concave arc or a combined shape of a concave arc and a convex arc, a curvature of one of at least four concave arcs of the shape of each of the third pixels 103 is greater or equal to a curvature of one of at least four concave arcs of the shape of each of the second pixels 102.

As shown in FIG. 1, a radius of curvature of the concave arc corresponding to the edge of the first pixel 101 that the second pixel 102 faces is greater than a radius of curvature of the concave arc corresponding to the edge of the first pixel 101 that the third pixel 103 faces.

As shown in FIG. 3, a radius of curvature of the convex arc corresponding to the edge of the second pixel 102 that the third pixel 102 faces is greater than a radius of curvature of the convex arc corresponding to the edge of the first pixel 101 that the third pixel 103 faces. A radius of curvature of the convex arc corresponding to the edge of the first pixel 101 that the third pixel 102 faces is equal to a radius of curvature of the convex arc corresponding to the edge of the first pixel 101 that the second pixel 102 faces.

As shown in FIG. 4, a radius of curvature of the convex arc corresponding to the edge of the first pixel 101 that the third pixel 102 faces is equal to a radius of curvature of the convex arc corresponding to the edge of the first pixel 101 that the second pixel 102 faces.

In the above technical solution, since the shape of the first pixel is circular or elliptical, and the shapes of the edges in the second pixel and the third pixel correspond to a concave arc, the sum of the radius of curvature of the shape of the edge of the first pixel and the width of the predetermined gap is equal to the radius of curvature of the concave arc corresponding to the edge of one of the second pixel and the third pixel, and thus, the embodiment of the present disclosure can effectively reduce the unused space between pixels, thereby effectively increasing the aperture ratio of the pixel.

In the above technical solution, since the shape of the first pixel is a circle or an ellipse, the shape of the second pixel is a circle, an ellipse, and a shape formed by a concave arc and a convex arc. In one case, the shape of the third pixel is a shape formed by a concave arc and a convex arc, thereby facilitating the fabrication of the pixel and effectively increasing the aperture ratio of the pixel.

A total area of all of the first pixels 101 (for example, an area of one of the first pixels 101, a sum of areas of the two first pixels 101), all of the total area of the two pixels 102 (for example, an area of one of the second pixels 102, a sum of areas of the two second pixels 102), the total area of all of the third pixels 103 (for example, an area of one of the third pixels 103, a sum of areas of the two third pixels 103) in the pixel repeating unit are inversely proportional to the luminous efficiency of the luminescent material of the first pixel 101, the luminous efficiency of the luminescent material of the second pixel 102, and the luminous efficiency of the luminescent material of the third pixel 103, respectively.

A ratio y1 of an aperture ratio of the red pixel to an aperture ratio of the green pixel is in the range of $0.78e^{(-1.98r)} \leq y1 \leq 2.297e^{(-1.85r)}$, and $0.1 \leq y1 \leq 3$, where r is a ratio of a luminous efficiency of the red pixel to a luminous efficiency of the green pixel, a ratio y2 of an aperture ratio of the blue pixel to the aperture ratio of the green pixel is in a range of $1.32e^{(-10.7b)} \leq y2 \leq 5.95e^{(-14.1b)}$, and $0.3 \leq y2 \leq 4$, where b is a ratio of a luminous efficiency of the blue pixel to the luminous efficiency of the green pixel.

Figure 9:
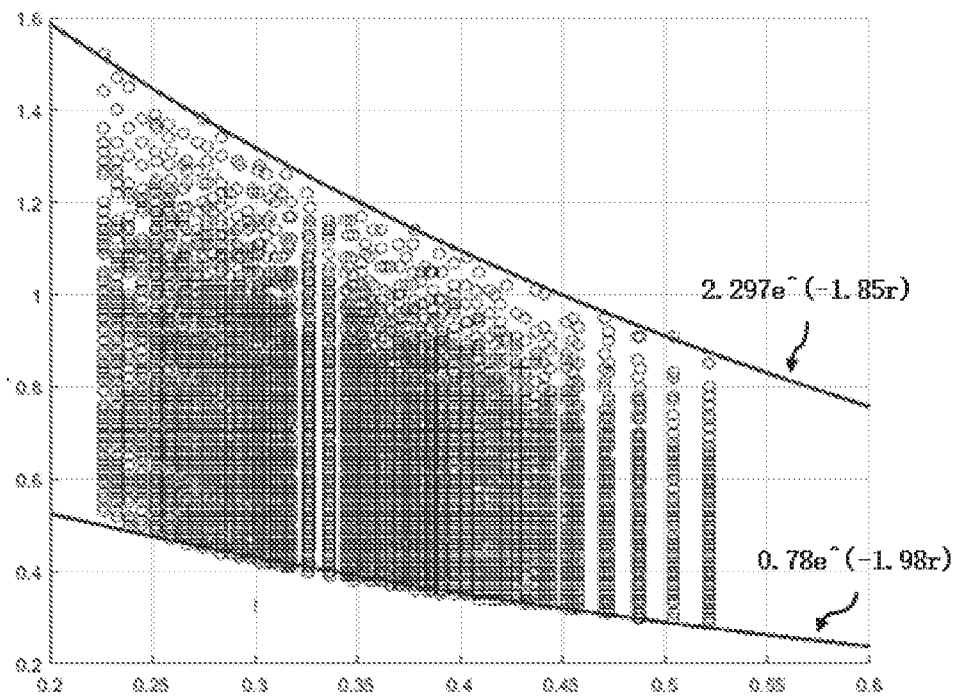
FIG. 9 is a schematic view of simulation data on a relationship between a ratio of an aperture ratio of red pixels to an aperture ratio of green pixels and a ratio of luminous efficiency of the red pixels to luminous efficiency of the green pixels in a display panel according to an embodiment of the present disclosure.
Figure 10:
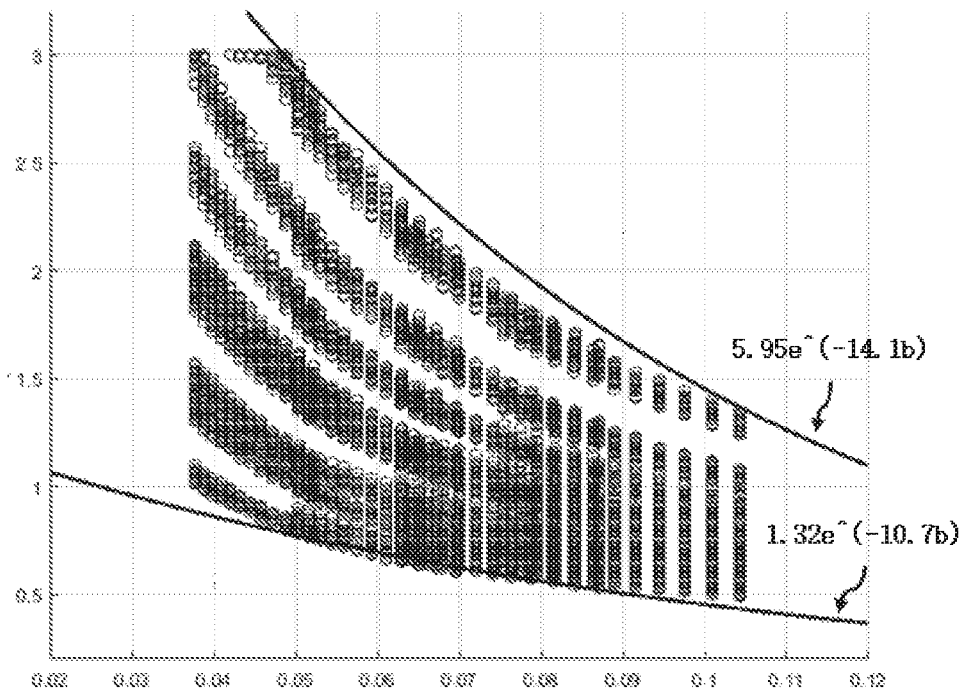
FIG. 10 is a schematic view of simulation data on a relationship between a ratio of an aperture ratio of blue pixels to an aperture ratio of green pixels and a ratio of luminous efficiency of the blue pixels to luminous efficiency of the green pixels in a display panel according to an embodiment of the present disclosure.

The ratio y1 of the aperture ratio of the red pixel to the aperture ratio of the green pixel may be, for example, one of 0.1, 0.2, 0.3, 0.4, 0.5, 0.6, 0.7, 0.8, 0.9, 1, 1.1, 1.2, 1.3, 1.4, 1.5 1.6, 1.7, 1.8, 1.9, 2, 2.1, 2.2, 2.3, 2.4, 2.5, 2.6, 2.7, 2.8, 2.9, and 3. Preferably, the ratio y1 of the aperture ratio of the red pixel to the aperture ratio of the green pixel is in a range of $0.2 \leq y1 \leq 2.2$. The ratio y2 of the aperture ratio of the blue pixel to the aperture ratio of the green pixel may be, for example, one of 0.3, 0.4, 0.5, 0.6, 0.7, 0.8, 0.9, 1, 1.1, 1.2, 1.3, 1.4, 1.5, 1.6, 1.7, 1.8, 1.9, 2, 2.1, 2.2, 2.3, 2.4, 2.5, 2.6, 2.7, 2.8, 2.9, 3, 3.1, 3.2, 3.3, 3.4, 3.5, 3.6, 3.7, 3.8, 3.9, and 4. Preferably, the ratio y2 of the aperture ratio of the blue pixel to the aperture ratio of the green pixel is in the range of $0.5 \leq y2 \leq 3.6$. As shown in FIG. 9 and FIG. 10, in this range, the current densities of various material efficiencies acting on red, green, and blue pixels are equal or substantially equal, while in long-term use, the degree of material attenuation of red, green, and blue pixels are similar, so that the overall color shift of the display panel can fall within a relatively good range.

The aperture ratio and the luminous efficiency of the red pixel, the green pixel, and the blue pixel in the conventional display panel do not have the above relationship (i.e., there is no: $0.78e^{(-1.98r)} \leq y1 \leq 2.297e^{(-1.85r)}$, and $0.1 \leq y1 \leq 3$, $1.32e^{(-10.7b)} \leq y2 \leq 5.95e^{(-14.1b)}$, and $0.3 \leq y2 \leq 4$), therefore, with the accumulation of use time, in the conventional display panel, the difference in the degree of attenuation of the efficacy of any one of the red pixel, the green pixel, and the blue pixel will become larger and larger, resulting in the degree of color shift (value) of the conventional display panel gradually going to a predetermined range (about the numerical range of the display effect) is divergent (i.e., deviated), that is, the display performance of the conventional display panel is getting worse.

In the display panel of the embodiment of the present disclosure, since $0.78e^{(-1.98r)} \leq y1 \leq 2.297e^{(-1.85r)}$, and $0.1 \leq y1 \leq 3$, $1.32e^{(-10.7b)} \leq y2 \leq 5.95e^{(-14.1b)}$, and $0.3 \leq y2 \leq 4$, therefore, In the case of the same usage time as a conventional display panel, the difference in the degree of attenuation of the light effect of any two of the red pixel, the green pixel, and the blue pixel in the display panel of the embodiment of the present disclosure is not much different, and the degree of color shift (value) of the display panel the embodiment of the present disclosure is still within a predetermined range, so that the display panel of the embodiment of the present disclosure maintains a better display performance for a longer duration than the conventional one. The display panel maintains the same display for a longer duration.

In the case where the pixel repeating unit includes one first pixel 101, one second pixel 102, and one third pixel 103, the aperture ratio of the first pixel 101 is equal to the area of the first pixel 101/the area of the pixel repeating unit, the aperture ratio of the second pixel 102 is equal to the area of the second pixel 102/the area of the pixel repeating unit, the aperture ratio of the third pixel 103 is equal to the area of the third pixel 103/the area of the pixel repeating unit.

In the case where the pixel repeating unit includes two first pixel 101, one second pixel 102, and one third pixel 103, the aperture ratio of the first pixels 101 is equal to the area of the two first pixels 101/the area of the pixel repeating unit, the aperture ratio of the second pixel 102 is equal to the area of the second pixel 102/the area of the pixel repeating unit, the aperture ratio of the third pixel 103 is equal to the area of the third pixel 103/the area of the pixel repeating unit.

In the case where the pixel repeating unit includes one first pixel 101, two second pixels 102, and one third pixel 103, the aperture ratio of the first pixel 101 is equal to the area of the first pixel 101/the area of the pixel repeating unit, the aperture ratio of the second pixels 102 is equal to the area of the two second pixels 102/the area of the pixel repeating unit, the aperture ratio of the third pixel 103 is equal to the area of the third pixel 103/the area of the pixel repeating unit.

In the case where the pixel repeating unit includes one first pixel 101, one second pixel 102, and two third pixels 103, the aperture ratio of the first pixel 101 is equal to the area of the first pixel 101/the area of the pixel repeating unit, the aperture ratio of the second pixel 102 is equal to the area of the second pixel 102/the area of the pixel repeating unit, the aperture ratio of the third pixels 103 is equal to the area of the two third pixels 103/the area of the pixel repeating unit.

In a case where the shape of the first pixel 101 is elliptical, the area of the first pixel 101 corresponds to the length of the long axis of the first pixel 101 and the length of the minor axis. In a case where the shape of the first pixel 101 is a circle, an area of the first pixel 101 corresponds to a length of a radius of the first pixel 101.

In the case where the shape of the second pixel 102 is a shape including a convex arc and/or a concave arc, the area of the second pixel 102=the area of the smallest circumcircle of the second pixel 102—a first overlap area of the pixel gap area and the second pixel 102; wherein the pixel gap area includes one of a first gap region between the first pixel 101 and the second pixel 102 and a second gap region between the second pixel 102 and the third pixel 103.

The first overlapping area corresponds to a distance between the first pixel 101 and the second pixel 102, a width of the first gap region, a curvature of an outer peripheral edge line of the first gap region, and also corresponds to a distance between the third pixel 103 and the second pixel 102, the width of the second gap region, and the curvature of an outer peripheral edge line of the second gap region.

In a case where the shape of the third pixel 103 is a shape including a concave arc or a combination of a concave arc and a convex arc, the area of the third pixel 103 is equal to the area of the minimum circumscribed circle of the third pixel 103 minus the second overlapping area of the pixel gap area pair and the third pixel 103. The pixel gap region includes at least one of a third gap region between the third pixel 103 and the first pixel 101 and a second gap region between the second pixel 102 and the third pixel 103.

The second overlapping area corresponds to a distance between the first pixel 101 and the third pixel 103, a width of the third gap region, a curvature of an outer peripheral edge line of the third gap region, and also corresponds to a distance between the third pixel 103 and the second pixel 102, the width of the second gap region, and the curvature of an outer peripheral edge line of the second gap region.

In particular, the shape of the first pixel 101 is elliptical, and the shape of the second pixel 102 and the shape of the third pixel 103 are both formed by convex arcs and/or concave arcs. The area of the first pixel 101, the area of the second pixel 102, and the area of the third pixel 103 are different, the shape of the second pixel 102 and the shape of the third pixel 103 are different, and the size of the second pixel 102 is different from the size of the third pixel 103.

In the case where the shape of the first pixel 101 is elliptical, the ratio of the major axis to the minor axis of the ellipse is in the range of 1 to 5, for example, the ratio is one of 1, 1.3, 1.6, 1.8, 2, 2.3, 2.5, 2.8, 3, 3.3, 3.5, 3.8, 4, 4.3, 4.5, 4.8, and 5. Preferably, the ratio of the major axis to the minor axis of the ellipse is in the range of 1 to 3.

Since the aperture ratios (areas) of the red pixel, the green pixel, and the blue pixel are set according to the luminous efficiency thereof, the current density acting on the different pixels is equal, thereby preventing the display panel from being displayed after the image is displayed (lighting) for a long time. The degree of color shift is out of a predetermined range (that is, the degree of color shift of the display panel is maintained within a predetermined range).

The shape of the at least one of the first pixel 101, the second pixel 102, and the third pixel 103 is a shape formed by a convex arc. The remaining at least two of the first pixel 101, the second pixel 102, and the third pixel 103 are formed by a convex arc and a concave arc. Two of the shapes of the edges of the first pixel 101, the second pixel 102, and the third pixel 103 are complementary in one of the first direction D1, the second direction D2, the third direction D3, and the fourth direction D4. Therefore, between two of the first pixel 101, the second pixel 102, and the third pixel 103, there must be a gap of a considerable width to prevent interference between the two pixels. The technical solution can make full use of the space of the display panel 10, reducing the excess space, so that the aperture ratios of the first pixel 101, the second pixel 102, and the third pixel 103 are improved.

The sum of the radius of curvature of the shape of the edge of the first pixel 101 toward one of the second pixel 102 and the third pixel 103 and the width of the predetermined gap is equal to the radius of curvature of the concave arc. Therefore, the aperture ratios of the first pixel 101, the second pixel 102, and the third pixel 103 can be effectively improved.

Since the two concave arcs in the shape formed by the convex arc and/or the concave arc are connected by the convex arc, it is convenient to manufacture in the corresponding mask (reducing the difficulty of making the mask). In addition, it is advantageous to increase the aperture ratios of the first pixel 101, the second pixel 102, and the third pixel 103.

In the above technical solution, the area of the first pixel, the area of the second pixel, the area of the third pixel are respectively inversely proportional to the luminous efficiency of the luminescent material of the first pixel, the luminous efficiency of the luminescent material of the second pixel, and the luminous efficiency of the luminescent material of the third pixel, so that the embodiment of the present disclosure can avoid issues of color shift of the display panel.

Any two of the first embodiment, the second embodiment, the third embodiment, and the fourth embodiment of the mask (a mask including a through hole having a first shape, a mask including a through hole having a second shape, and a through hole having a third shape) of the present disclosure are same or similar.

The mask of the embodiment of the present disclosure is used to form a pixel (including the first pixel 101, the second pixel 102, and the third pixel 103). Specifically, the mask is used to form an anode layer of a pixel on an array element plate of the display panel 10 and/or form a layer of luminescent material on the pixel defining layer of the display panel 10 by an evaporation process. The array element plate includes a substrate, a thin film transistor switch, an insulating layer, and the like, and the pixel defining layer is disposed on the array element plate.

A through hole is disposed in the mask. At least two of the through holes are along at least two of the first direction D1, the second direction D2, the third direction D3, and the fourth direction D4 and are arranged in an array. The first direction D1 is perpendicular to the second direction D2, and the third direction D3 is a direction having an angle of less than 90 degrees with the first direction D1, and the fourth direction D4 is perpendicular to the third direction D3.

The shape of the through hole is a shape formed by a convex arc and/or a concave arc. That is, the shape of the through hole corresponds to the shape of the pixel (including the first pixel 101, the second pixel 102, and the third pixel 103).

The through holes of different shapes are respectively disposed on different masks, for example, three different shapes of through holes are respectively disposed on three different masks. Alternatively, the through holes of different shapes are all disposed in the same mask, for example, three different shapes of through holes are all disposed in the same mask. The three different shapes include a first shape, a second shape, and a third shape.

The shape formed by the convex arc and/or the concave arc includes: a shape composed of four-segment concave arc (including a circle, an ellipse, etc.), a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

A first projection of the through hole having the first shape (the first through hole 201) in a predetermined coordinate system XOY and a second projection of the through hole having the second shape (the second through hole 301) in the predetermined coordinate system are staggered in any one of the first direction D1, the second direction D2, the third direction D3, and the fourth direction D4.

The first projection of the through hole having the first shape (the first through hole 201) in the predetermined coordinate system and a third projection of the through hole having the third shape (the third through hole 401) in the predetermined coordinate system are staggered in any one of the first direction D1, the second direction D2, the third direction D3, and the fourth direction D4.

A second projection of the through hole having the second shape (the second through hole 301) in the predetermined coordinate system and the third projection of the through hole having the third shape (the third through hole 401) in the predetermined coordinate system are staggered in any one of the first direction D1, the second direction D2, the third direction D3, and the fourth direction D4.

Shapes of opposite edges of adjacent two of the first projection, the second projection, and the third projection are complementary in one of the first direction D1, the second direction D2, the third direction D3, and the fourth direction D4.

Two number axes of the predetermined coordinate system are parallel to the first direction D1 and the second direction D2, respectively.

The shape of any one of the first projection, the second projection, and the third projection is a shape formed by a convex arc and/or a concave arc.

The shape of at least one of the first projection, the second projection, and the third projection is a shape formed by a convex arc, the shape of at most two of the first projection, the second projection, and the third projection is a shape formed by a convex arc, and the shapes of the remaining at least two of the first projection, the second projection, and the third projection are a shape formed by a concave arc, or the shapes of the remaining at least two of the first projection, the second projection, and the third projection are formed by a convex arc and a concave arc (a convex arc connecting the two concave arcs).

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in each other. At least one of the first projections is located in a range surrounded by at least four of the second projections, at least one of the first projections is located in a range surrounded by at least four of the third projections, at least one of the second projections is located in a range surrounded by at least four of the first projections, at least one of the second projections is located in a range surrounded by at least four of the third projections, at least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and a third gap is disposed between the third projection and the adjacent first projection.

At least a portion of the third projection is convex toward the first gap, at least a portion of the first projection is convex toward the second gap, and at least a portion of the second projection is convex toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

The shape of the first through hole 201 is circular or elliptical, and the shape of the second through hole 301 is one of circular, elliptical, and a shape formed by a convex arc and/or a concave arc. The shape of the third through hole 401 is a shape formed by concave arc or a combination of a concave arc and a convex arc. The circular or elliptical shape is one of the shapes formed by the convex arcs. Of course, the shape formed by the convex arcs may further include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

Figure 5A:
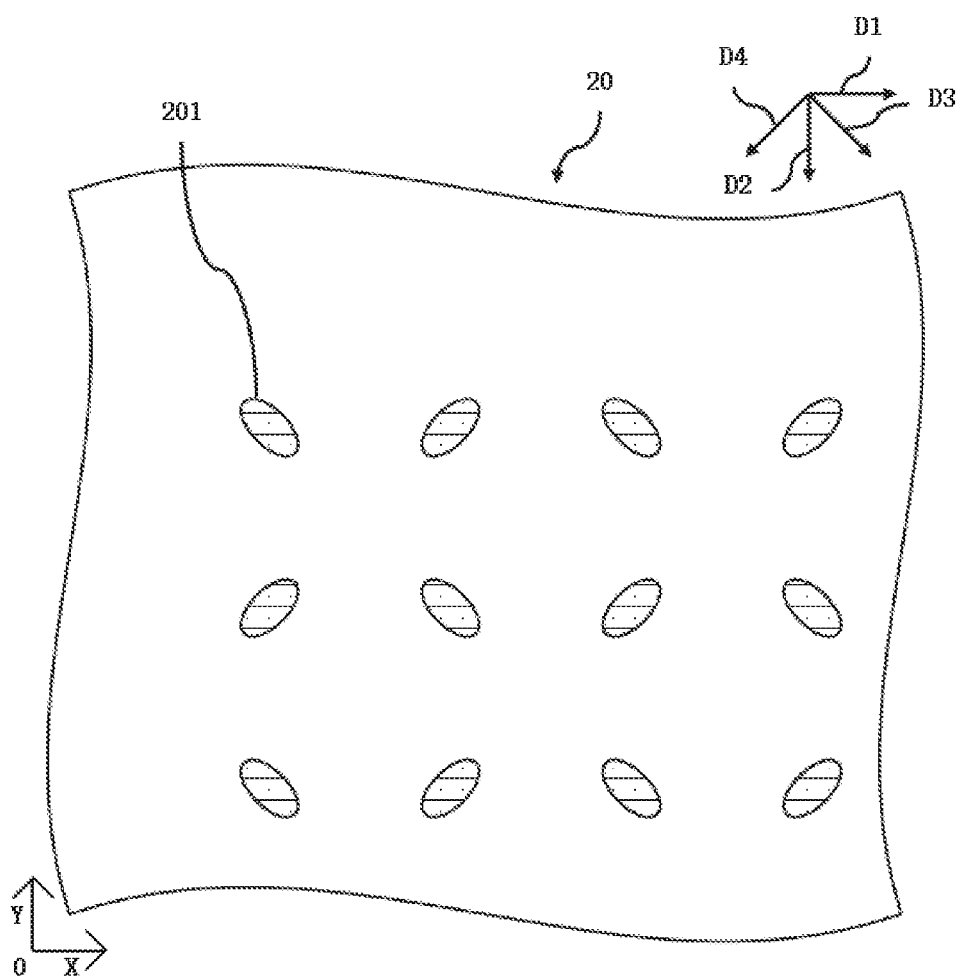
FIG. 5A is a schematic view of a shape and a position of a first through hole in a first mask according to a first embodiment of the present disclosure.
Figure 5B:
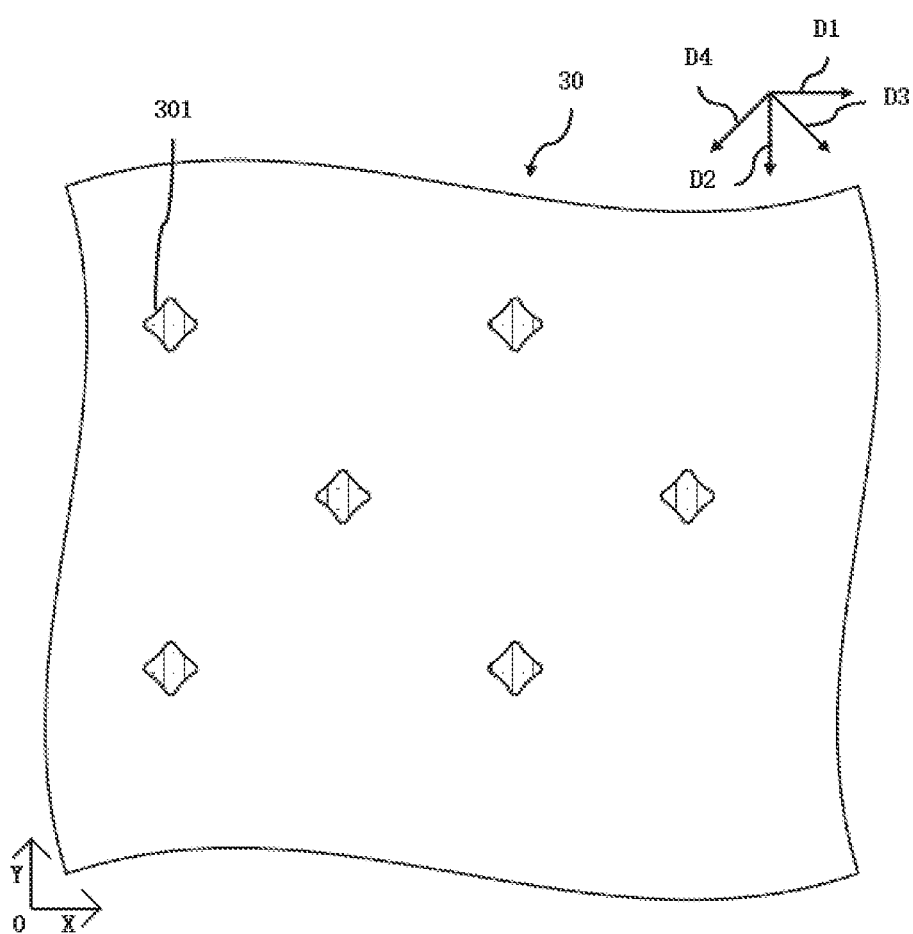
FIG. 5B is a schematic view of a shape and a position of a second through hole in a second mask according to a first embodiment of the present disclosure.
Figure 5C:
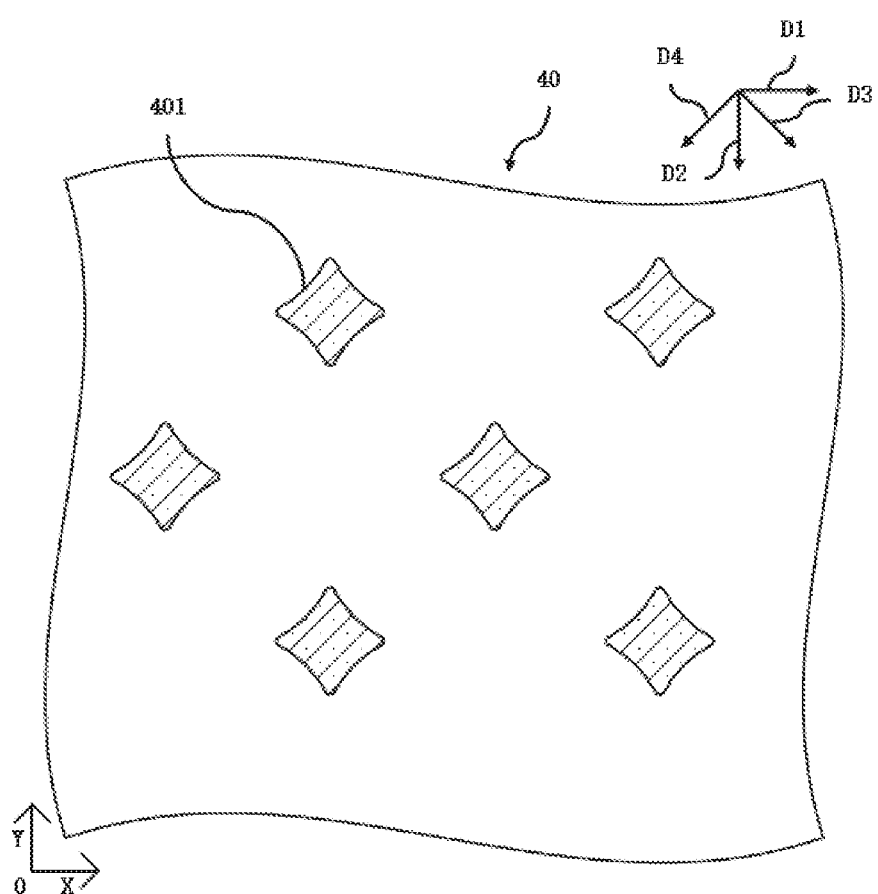
FIG. 5C is a schematic view of a shape and a position of a third through hole in a second mask according to a third embodiment of the present disclosure.

As shown in FIG. 5A, FIG. 5B, and FIG. 5C, the shape of the first through hole 201 is circular or elliptical, and the shapes of the second through hole 301 and the third through hole 401 are both a shape composed of four-segment convex arc and four-segment concave arc.

Figure 6A:
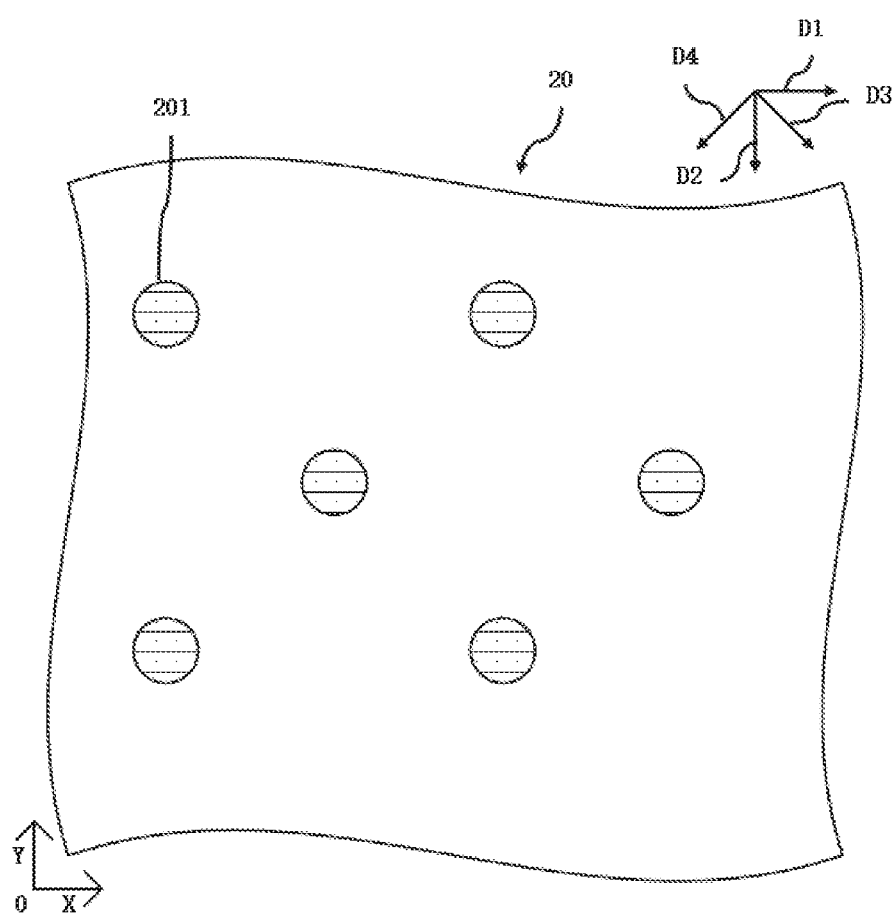
FIG. 6A is a schematic view of a shape and a position of a first through hole in a first mask according to a first embodiment of the present disclosure.
Figure 6B:
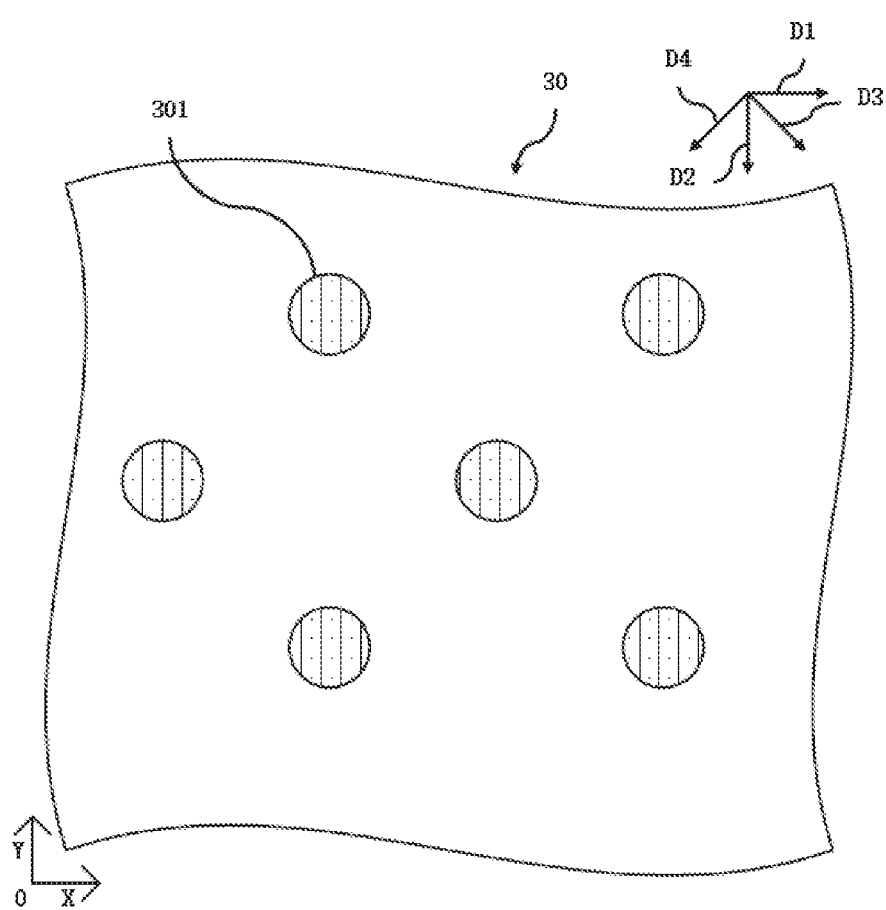
FIG. 6B is a schematic view of a shape and a position of a second through hole in a second mask according to a first embodiment of the present disclosure.
Figure 6C:
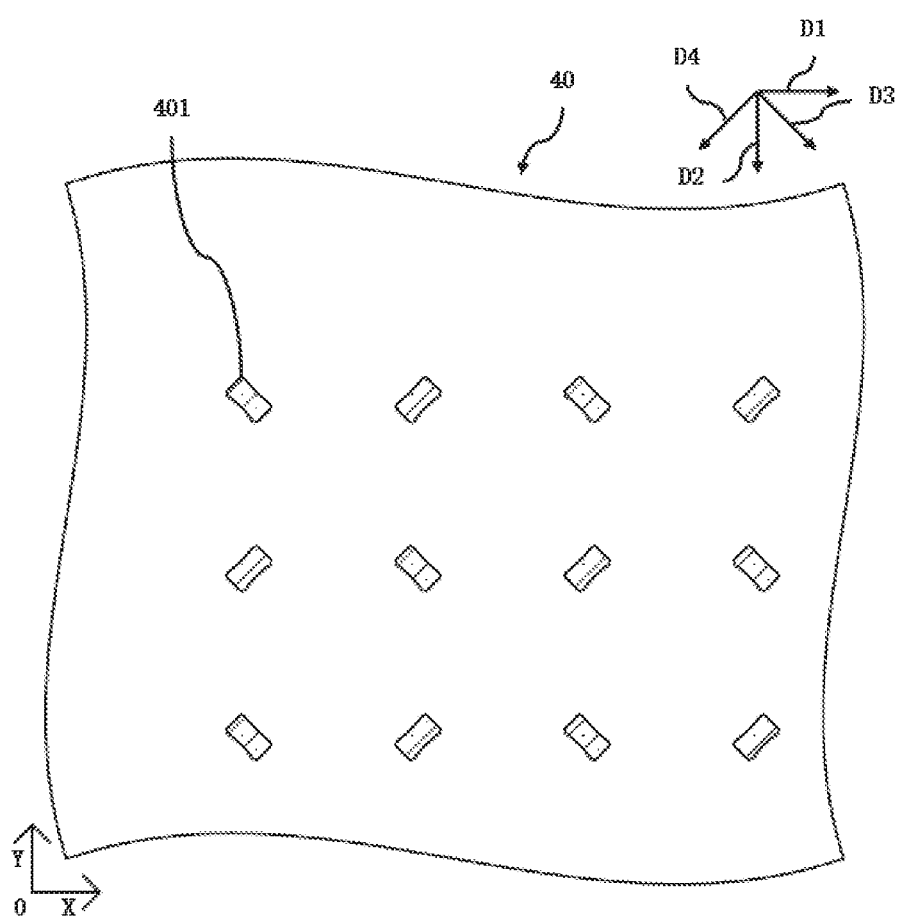
FIG. 6C is a schematic view of a shape and a position of a third through hole in a second mask according to a third embodiment of the present disclosure.

As shown in FIG. 6A, FIG. 6B, and FIG. 6C, the shape of the first through hole 201 is circular or elliptical, the shape of the second through hole 301 is circular or elliptical, and the third through hole 401 is a shape composed of four-segment convex arc and four-segment concave arc.

Figure 7A:
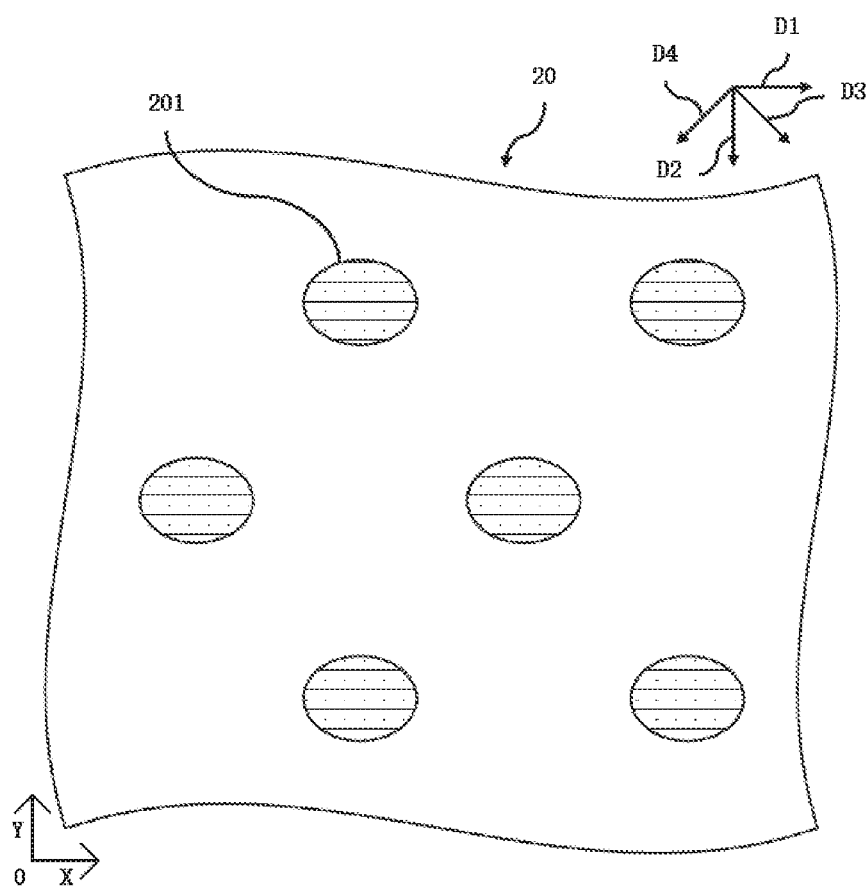
FIG. 7A is a schematic view of a shape and a position of a first through hole in a first mask according to a first embodiment of the present disclosure.
Figure 7B:
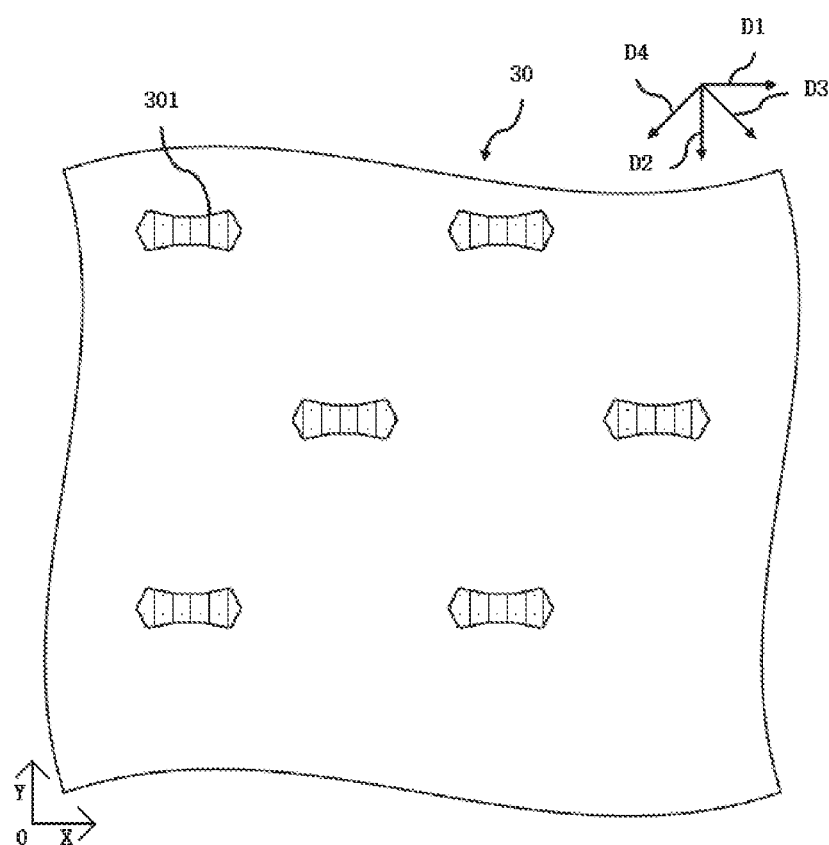
FIG. 7B is a schematic view of a shape and a position of a second through hole in a second mask according to a first embodiment of the present disclosure.
Figure 7C:
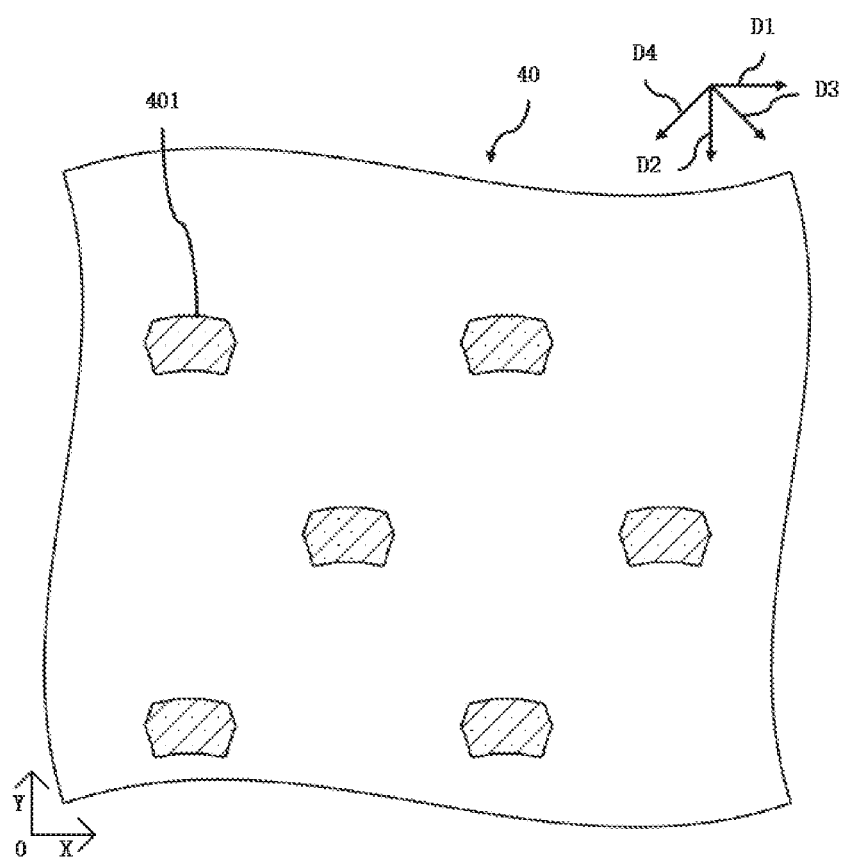
FIG. 7C is a schematic view of a shape and a position of a third through hole in a second mask according to a third embodiment of the present disclosure.

As shown in FIG. 7A, FIG. 7B, and FIG. 7C, the shape of the first through hole 201 is circular or elliptical, the second through hole 301 is a shape composed of six-segment convex arc and six-segment concave arc, and the third through hole 401 is a shape composed of seven-segment convex arc and five-segment concave arc.

Figure 8A:
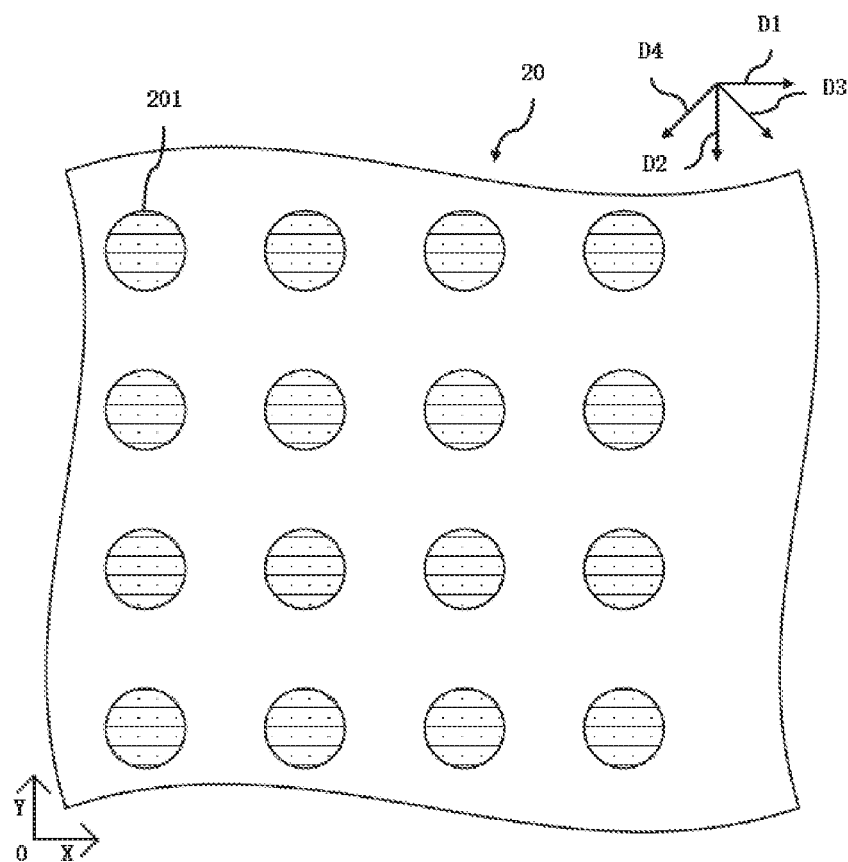
FIG. 8A is a schematic view of a shape and a position of a first through hole in a first mask according to a first embodiment of the present disclosure.
Figure 8B:
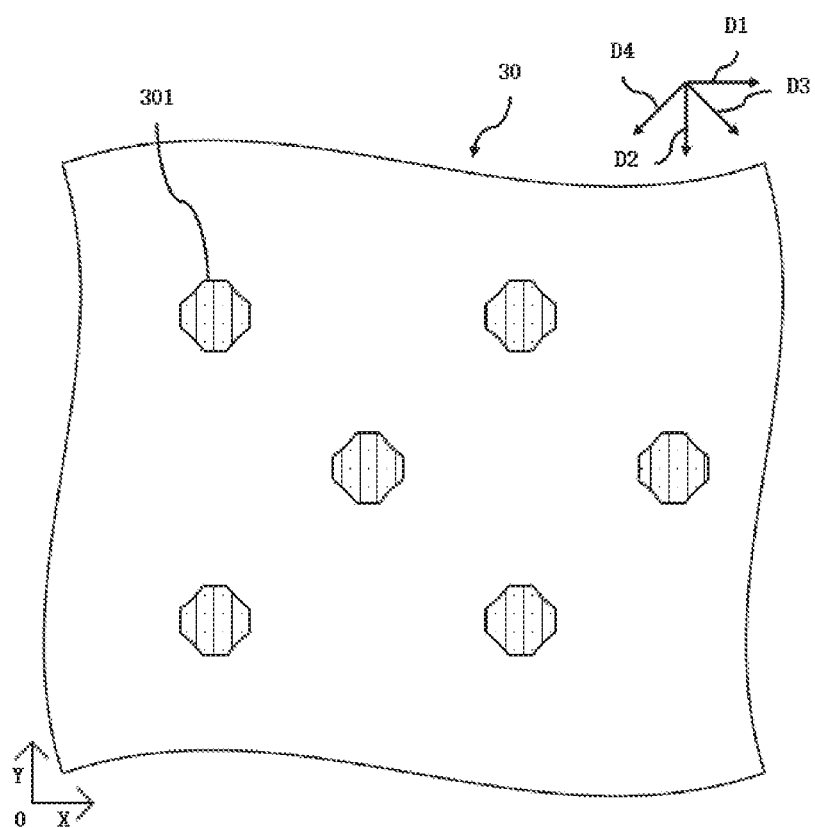
FIG. 8B is a schematic view of a shape and a position of a second through hole in a second mask according to a first embodiment of the present disclosure.
Figure 8C:
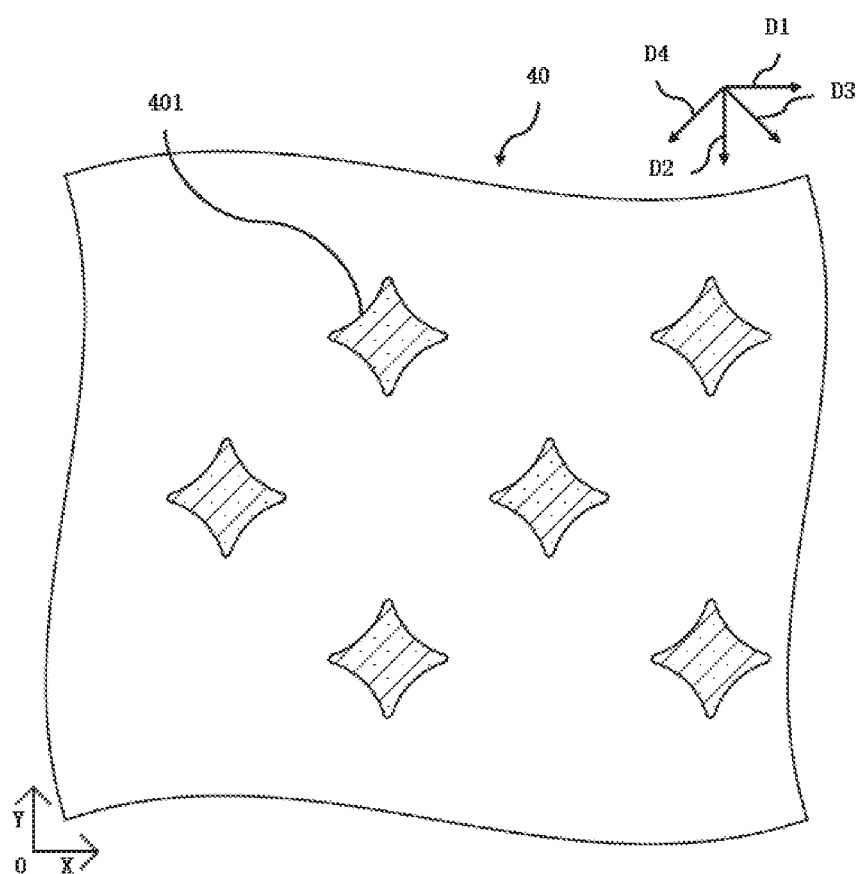
FIG. 8C is a schematic view of a shape and a position of a third through hole in a second mask according to a third embodiment of the present disclosure.

As shown in FIG. 8A, FIG. 8B, and FIG. 8C, the shape of the first through hole 201 is circular or elliptical, the second through hole 301 is a shape composed of eight-segment convex arc and eight-segment concave arc, and the third through hole 401 is a shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first projection, the second projection, and the third projection are different.

The shape of the edge of one of the second projection and the third projection in the third direction D3 or the fourth direction D4 corresponds to a concave arc.

A sum of a radius of curvature of a shape of an edge of one of the first projection, the second projection, and the third projection and a width of a predetermined gap is equal to a radius of curvature of the concave arc corresponding to the edge of one of the first projection, the second projection, and the third projection in the third direction D3 and the fourth direction D4.

The predetermined gap is a gap between an edge of one of the first projection, the second projection, and the third projection and an edge of the adjacent the first projection in one of the third direction D3 and the fourth direction D4. A width of the predetermined gap in the third direction D3 is equal to a width of the predetermined gap in the fourth direction D4.

An arc and an extended arc thereof corresponding to an edge of the third projection facing the first projection and an arc and an extended arc thereof corresponding to an edge of the second projection facing the first projection form a predetermined shape, and the predetermined shape includes a circle or an ellipse.

A shape of each of the first projection is the same as or similar to the predetermined shape.

A center of a shape of each of the first projection is the same as a center of the predetermined shape.

When the shape of the first projection includes an ellipse, a long axis of the ellipse points to one of the second projection and the third projection, a short axis of the ellipse points to the other of the second projection and the third projection.

An angle between the long axis of the ellipse and the first direction D1 or the second direction D2 ranges between 0 degree and 90 degrees.

When a shape of the second projection includes a circle or an ellipse, and a shape of the third projection includes a concave arc or a combined shape of a concave arc and a convex arc, the shape of the third projection includes a curvature of one of at least four concave arcs that is greater or less than another of the at least four concave arcs.

When a shape of the second projection and a shape of the third projection both include a concave arc or a combined shape of a concave arc and a convex arc, a curvature of one of at least four concave arcs of the shape of the third projection is greater or equal to a curvature of one of at least four concave arcs of the shape of the second projection.

Any two of the first embodiment, the second embodiment, the third embodiment, and the fourth embodiment of the mask assembly of the embodiment of the present disclosure are same or similar.

The mask assembly of the embodiment of the present disclosure includes three masks in which a through hole is provided.

At least two of the through holes are arranged in an array in at least two directions of the first direction D1, the second direction D2, the third direction D3, and the fourth direction D4. The first direction D1 is perpendicular to the second direction D2, and the third direction D3 is a direction having an angle of less than 90 degrees with the first direction D1, and the fourth direction D4 is perpendicular to the third direction D3.

The shape of the through hole is a shape formed by a convex arc and/or a concave arc.

The three masks are the first mask 20, the second mask 30, and the third mask 40, respectively. The through hole of the first mask 20 is the first through hole 201, the through hole of the second mask 30 is the second through hole 301, and the through hole of the third mask 40 is the third through hole 401.

A first projection of the first through hole 201 in a predetermined coordinate system and a second projection of the second through hole 301 in the predetermined coordinate system are staggered in any one of the first direction D1, the second direction D2, the third direction D3, and the fourth direction D4.

The first projection of the first through hole 201 in the predetermined coordinate system and a third projection of the third through hole 401 in the predetermined coordinate system are staggered in any one of the first direction D1, the second direction D2, the third direction D3, and the fourth direction D4.

A second projection of the second through hole 301 in the predetermined coordinate system and the third projection of the third through hole 401 in the predetermined coordinate system are staggered in any one of the first direction D1, the second direction D2, the third direction D3, and the fourth direction D4.

Two number axes of the predetermined coordinate system are parallel to the first direction D1 and the second direction D2, respectively.

The shape of any one of the first projection, the second projection, and the third projection is a shape formed by a convex arc and/or a concave arc.

The shape of at least one of the first projection, the second projection, and the third projection is a shape formed by a convex arc, the shape of at most two of the first projection, the second projection, and the third projection is a shape formed by a convex arc, and the shapes of the remaining at least two of the first projection, the second projection, and the third projection are a shape formed by a concave arc, or the shapes of the remaining at least two of the first projection, the second projection, and the third projection are formed by a convex arc and a concave arc (a convex arc connecting the two concave arcs).

Shapes of edges of two of the first projection, the second projection, and the third projection are complementary in one of the first direction, the second direction, the three direction, and the fourth direction.

At least two of the first projection, the second projection, and the third projection are alternately arranged in at least one of the first direction D1, the second direction D2, the third direction D3, and the fourth direction D4.

Specifically, a first projection array composed of at least two of the first projections, a second projection array composed of at least two of the second projections, and a third projection array composed of at least two of the third projections are embedded in each other. At least one of the first projections is located in a range surrounded by at least four of the second projections, at least one of the first projections is located in a range surrounded by at least four of the third projections, at least one of the second projections is located in a range surrounded by at least four of the first projections, at least one of the second projections is located in a range surrounded by at least four of the third projections, at least one of the third projections is located in a range surrounded by at least four of the first projections, and at least one of the third projections is located in a range surrounded by at least four of the second projections.

A first gap is disposed between the first projection and the adjacent second projection, a second gap is disposed between the second projection and the adjacent third projection, and a third gap is disposed between the third projection and the adjacent first projection.

At least a portion of the third projection is convex toward the first gap, at least a portion of the first projection is convex toward the second gap, and at least a portion of the second projection is convex toward the third gap.

The width of the gap between two of the first projection, the second projection, and the third projection alternately arranged in the third direction D3 is equal to the width of the gap between two of the first projection, the second projection, and the third projection alternately arranged in the fourth direction D4.

The shape of the first through hole 201 is circular or elliptical, and the shape of the second through hole 301 is one of circular, elliptical, and a shape formed by a convex arc and/or a concave arc. The shape of the third through hole 401 is a shape formed by concave arc or a combination of a concave arc and a convex arc. The circular or elliptical shape is one of the shapes formed by the convex arcs. Of course, the shape formed by the convex arcs may further include other shapes.

The shape formed by the convex arc and/or the concave arc includes: a shape composed of a convex arc, a shape composed of four-segment concave arc, a shape composed of six-segment concave arc, a shape composed of one-segment convex arc and five-segment concave arc, a shape composed of eight-segment concave arc, a shape composed of four-segment convex arc and four-segment concave arc, a shape composed of six-segment convex arc and six-segment concave arc, a shape composed of seven-segment convex arc and five-segment concave arc, and a shape composed of eight-segment convex arc and eight-segment concave arc.

In the shape composed of four-segment concave arc, the four-segment concave arc is connected end to end.

In the shape composed of six-segment concave arc, the six-segment concave arc is connected end to end.

In the shape composed of one-segment convex arc and five-segment concave arc, the one-segment convex arc and the five-segment concave arc connected end to end.

In the shape composed of eight-segment concave arc, the eight-segment concave arc is connected end to end.

In the shape composed of four-segment convex arc and four-segment concave arc, two ends of the convex arc are respectively connected to two adjacent concave arcs, and two ends of the concave arc are respectively connected to two adjacent convex arcs.

In the shape composed of six-segment convex arc and six-segment concave arc, two ends of the convex arc are respectively connected to two adjacent concave arcs, and two ends of the concave arc are respectively connected to two adjacent convex arcs.

In the shape composed of seven-segment convex arc and five-segment concave arc, the seven-segment convex arc and the five-segment concave arc are connected end to end. The seven-segment convex arc and the five-segment concave arc are connected together at intervals.

In the shape composed of eight-segment convex arc and eight-segment concave arc, two ends of the convex arc are respectively connected to two adjacent concave arcs, and two ends of the concave arc are respectively connected to two adjacent convex arcs.

As shown in FIG. 5A, FIG. 5B, and FIG. 5C, the shape of the first through hole 201 is circular or elliptical, and the shapes of the second through hole 301 and the third through hole 401 are both a shape composed of four-segment convex arc and four-segment concave arc.

As shown in FIG. 6A, FIG. 6B, and FIG. 6C, the shape of the first through hole 201 is circular or elliptical, the shape of the second through hole 301 is circular or elliptical, and the third through hole 401 is a shape composed of four-segment convex arc and four-segment concave arc.

As shown in FIG. 7A, FIG. 7B, and FIG. 7C, the shape of the first through hole 201 is circular or elliptical, the second through hole 301 is a shape composed of six-segment convex arc and six-segment concave arc, and the third through hole 401 is a shape composed of seven-segment convex arc and five-segment concave arc.

As shown in FIG. 8A, FIG. 8B, and FIG. 8C, the shape of the first through hole 201 is circular or elliptical, the second through hole 301 is a shape composed of eight-segment convex arc and eight-segment concave arc, and the third through hole 401 is a shape composed of four-segment convex arc and four-segment concave arc.

The shape composed of a convex arc, the shape composed of four-segment concave arc, the shape composed of six-segment concave arc, the shape composed of eight-segment concave arc, the shape composed of four-segment convex arc and four-segment concave arc, the shape composed of six-segment convex arc and six-segment concave arc, and the shape composed of eight-segment convex arc and eight-segment concave arc are centrally symmetrical.

Shapes, sizes, and areas of any two of the first projection, the second projection, and the third projection are different.

The shape of the edge of one of the second projection and the third projection in the third direction D3 or the fourth direction D4 corresponds to a concave arc.

A sum of a radius of curvature of a shape of an edge of one of the first projection, the second projection, and the third projection and a width of a predetermined gap is equal to a radius of curvature of the concave arc.

The predetermined gap is a gap between an edge of one of the first projection, the second projection, and the third projection and an edge of the adjacent the first projection in one of the third direction D3 and the fourth direction D4. A width of the predetermined gap in the third direction D3 is equal to a width of the predetermined gap in the fourth direction D4.

An arc and an extended arc thereof corresponding to an edge of the third projection facing the first projection and an arc and an extended arc thereof corresponding to an edge of the second projection facing the first projection form a predetermined shape, and the predetermined shape includes a circle or an ellipse.

A shape of each of the first projection is the same as or similar to the predetermined shape.

A center of a shape of each of the first projection is the same as a center of the predetermined shape.

When the shape of the first projection includes an ellipse, a long axis of the ellipse points to one of the second projection and the third projection, a short axis of the ellipse points to the other of the second projection and the third projection.

An angle between the long axis of the ellipse and the first direction D1 or the second direction D2 ranges between 0 degree and 90 degrees.

When a shape of the second projection includes a circle or an ellipse, and a shape of the third projection includes a concave arc or a combined shape of a concave arc and a convex arc, the shape of the third projection includes a curvature of one of at least four concave arcs that is greater or less than another of the at least four concave arcs.

When a shape of the second projection and a shape of the third projection both include a concave arc or a combined shape of a concave arc and a convex arc, a curvature of one of at least four concave arcs of the shape of the third projection is greater or equal to a curvature of one of at least four concave arcs of the shape of the second projection.

In the above technical solution, since the mask assembly includes three masks, the mask is provided with a through hole. The through hole has a shape formed by a convex arc and/or a concave arc. The masks are respectively a first mask, a second mask, and a third mask. The first through hole of the first mask has a first projection in the predetermined coordinate system, the second through hole of the second mask has a second projection in the predetermined coordinate system, and the third through hole of the third mask has the third projection in the predetermined coordinate system. The shapes of the opposite edges of the adjacent two of the first projection, the second projection, and the third projections are complementary, so that the embodiment of the present disclosure can reduce the unused area between the pixels in the display panel, thereby increasing the aperture ratio of the pixels.

In the above, the present disclosure has been disclosed in the above preferred embodiments, but the preferred embodiments are not intended to limit the present disclosure. Various changes and modifications can be made by those skilled in the art without departing from the spirit and scope of the present disclosure. The scope of protection of the present disclosure is therefore defined by the scope of the claims.

What is claimed is:

1. A display panel, comprising:
at least two first pixels;
at least two second pixels; and
at least two third pixels, wherein at least two of each of the first pixels, each of the second pixels, and each of the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction;
wherein a shape of each of the first pixels comprises an ellipse or a circle;
wherein a shape of an edge of one of each of the second pixels and each of the third pixels in the third direction and the fourth direction corresponds to a concave arc, a sum of a radius of curvature of a shape of an edge of each of the first pixels facing one of each of the second pixels and each of the third pixels and a width of a predetermined gap is equal to a radius of curvature of the concave arc corresponding to the edge of one of each of the second pixels and each of the third pixels in the third direction and the fourth direction;
wherein when the shape of each of the first pixels comprises the ellipse, a long axis of the ellipse points to one of each of the second pixels and each of the third pixels, a short axis of the ellipse points to the other of each of the second pixels and each of the third pixels;
wherein when the shape of the first pixel is the ellipse, the shape of the second pixel and the shape of the third pixel are both shapes that comprises an inner concave arc or a combination of the inner concave arc and an outer convex arc, a curvature of one of at least four inner concave arcs included in the shape of the third pixel is greater than a curvature of one of at least four inner concave arcs included in the shape of the second pixel;
wherein a width of the gap between the first pixel and the second pixel in the third direction is equal to a width of the gap between the first pixel and the third pixel in the fourth direction;
wherein when a shape of each of the second pixels and a shape of each of the third pixels both comprise a concave arc or a combined shape of a concave arc and a convex arc, a curvature of one of at least four concave arcs of the shape of each of the third pixels is greater or equal to a curvature of one of at least four concave arcs of the shape of each of the second pixels.

2. The display panel according to claim 1, wherein shapes of edges of two of each of the first pixels, each of the second pixels, and each of the third pixels are complementary in one of the first direction, the second direction, the third direction, and the fourth direction.

3. The display panel according to claim 1, wherein each of the first pixels, each of the second pixels, and each of the third pixels are ones of different red, green, and blue pixels.

4. The display panel according to claim 3, wherein a ratio y1 of an aperture ratio of the red pixel to an aperture ratio of the green pixel is in the range of $0.78e^{\wedge}(-1.98r) \leq y1 \leq 2.297e^{\wedge}(-1.85r)$, and $0.1 \leq y1 \leq 3$, where r is a ratio of a luminous efficiency of the red pixel to a luminous efficiency of the green pixel;

a ratio y2 of an aperture ratio of the blue pixel to the aperture ratio of the green pixel is in a range of $1.32e^{\wedge}(-10.7b) \leq y2 \leq 5.95e^{\wedge}(-14.1b)$, and $0.3 \leq y2 \leq 4$, where b is a ratio of a luminous efficiency of the blue pixel to the luminous efficiency of the green pixel.

5. The display panel according to claim 4, wherein the ratio y1 of the aperture ratio of the red pixel to the aperture ratio of the green pixel is in a range of $0.2 \leq y1 \leq 2.2$;

the ratio y2 of the aperture ratio of the blue pixel to the aperture ratio of the green pixel is in the range of $0.5 \leq y2 \leq 3.6$.

6. A display panel, comprising:

at least two first pixels;

at least two second pixels; and at least two third pixels, wherein at least two of each of the first pixels, each of the second pixels, and each of the third pixels are alternately arranged in at least one of a first direction, a second direction, a third direction, and a fourth direction, the first direction is perpendicular to the second direction, the third direction is a direction having an angle of less than 90 degrees with the first direction, and the fourth direction is perpendicular to the third direction;

wherein a shape of each of the first pixels comprises an ellipse;

wherein a shape of an edge of one of each of the second pixels and each of the third pixels in the third direction and the fourth direction corresponds to a concave arc, a sum of a radius of curvature of a shape of an edge of each of the first pixels facing one of each of the second pixels and each of the third pixels and a width of a predetermined gap is equal to a radius of curvature of the concave arc corresponding to the edge of one of each of the second pixels and each of the third pixels in the third direction and the fourth direction;

wherein when the shape of each of the first pixels comprises the ellipse, a long axis of the ellipse points to one of each of the second pixels and each of the third pixels, a short axis of the ellipse points to the other of each of the second pixels and each of the third pixels;

wherein when the shape of the first pixel is the ellipse, the shape of the second pixel and the shape of the third pixel are both shapes that comprises an inner concave arc or a combination of the inner concave arc and an outer convex arc, a curvature of one of at least four inner concave arcs included in the shape of the third pixel is greater than a curvature of one of at least four inner concave arcs included in the shape of the second pixel;

wherein a width of the gap between the first pixel and the second pixel in the third direction is equal to a width of the gap between the first pixel and the third pixel in the fourth direction;

wherein when the shape of each of the first pixels comprises the ellipse, a ratio of a long axis to a short axis of the ellipse is in a range of 1 to 3.

* * * * *